(12) United States Patent
Hsieh et al.

(10) Patent No.: US 12,051,704 B2
(45) Date of Patent: Jul. 30, 2024

(54) PIXEL ARRAY INCLUDING OCTAGON PIXEL SENSORS

(71) Applicant: Taiwan Semiconductor Manufacturing Company, Ltd., Hsinchu (TW)

(72) Inventors: Feng-Chien Hsieh, Pingtung (TW); Yun-Wei Cheng, Taipei (TW); Kuo-Cheng Lee, Tainan (TW); Cheng-Ming Wu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 388 days.

(21) Appl. No.: 17/446,401

(22) Filed: Aug. 30, 2021

(65) Prior Publication Data
US 2023/0067395 A1    Mar. 2, 2023

(51) Int. Cl.
*H01L 27/14*    (2006.01)
*H01L 27/146*    (2006.01)

(52) U.S. Cl.
CPC .. *H01L 27/14605* (2013.01); *H01L 27/14607* (2013.01); *H01L 27/1462* (2013.01); *H01L 27/14621* (2013.01); *H01L 27/14627* (2013.01); *H01L 27/14645* (2013.01); *H01L 27/14649* (2013.01); *H01L 27/14685* (2013.01)

(58) Field of Classification Search
CPC ......... H01L 27/14605; H01L 27/14607; H01L 27/1462; H01L 27/14621; H01L 27/14627; H01L 27/14645; H01L 27/14649; H01L 27/14685
See application file for complete search history.

(56) References Cited

U.S. PATENT DOCUMENTS

| | | | | |
|---|---|---|---|---|
| 2011/0013055 A1* | 1/2011 | Sul | .................... | H01L 27/14625 348/E5.091 |
| 2018/0277580 A1* | 9/2018 | Chiang | ............. | H01L 27/14645 |
| 2019/0383725 A1* | 12/2019 | Petersen | ............ | G01N 15/1429 |
| 2020/0058684 A1* | 2/2020 | Wu | .................... | H01L 27/14607 |

FOREIGN PATENT DOCUMENTS

EP    2978022 A2 *    1/2016    ......... H01L 27/1462

* cited by examiner

*Primary Examiner* — Kevin K Pyo
(74) *Attorney, Agent, or Firm* — Harrity & Harrity, LLP

(57) ABSTRACT

In some implementations, a pixel array may include a near infrared (NIR) cut filter layer for visible light pixel sensors of the pixel array. The NIR cut filter layer is included in the pixel array to absorb or reflect NIR light for the visible light pixel sensors to reduce the amount of MR light absorbed by the visible light pixel sensors. This increases the accuracy of the color information provided by the visible light pixel sensors, which can be used to produce more accurate images. In some implementations, the visible light pixel sensors and/or MR pixel sensors may include high absorption regions to adjust the orientation of the angle of refraction for the visible light pixel sensors and/or the MR pixel sensors, which may increase the quantum efficiency of the visible light pixel sensors and/or the MR pixel sensors.

20 Claims, 23 Drawing Sheets

PIXEL ARRAY INCLUDING OCTAGON PIXEL SENSORS

BACKGROUND

Complementary metal oxide semiconductor (CMOS) image sensors utilize light-sensitive CMOS circuitry, referred to as pixel sensors, to convert light energy into electrical energy. A pixel sensor typically includes a photodiode formed in a silicon substrate. As the photodiode is exposed to light, an electrical charge is induced in the photodiode. The photodiode may be coupled to a switching transistor, which is used to sample the charge of the photodiode. Colors may be determined by placing color filters over photodiodes of a CMOS image sensor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
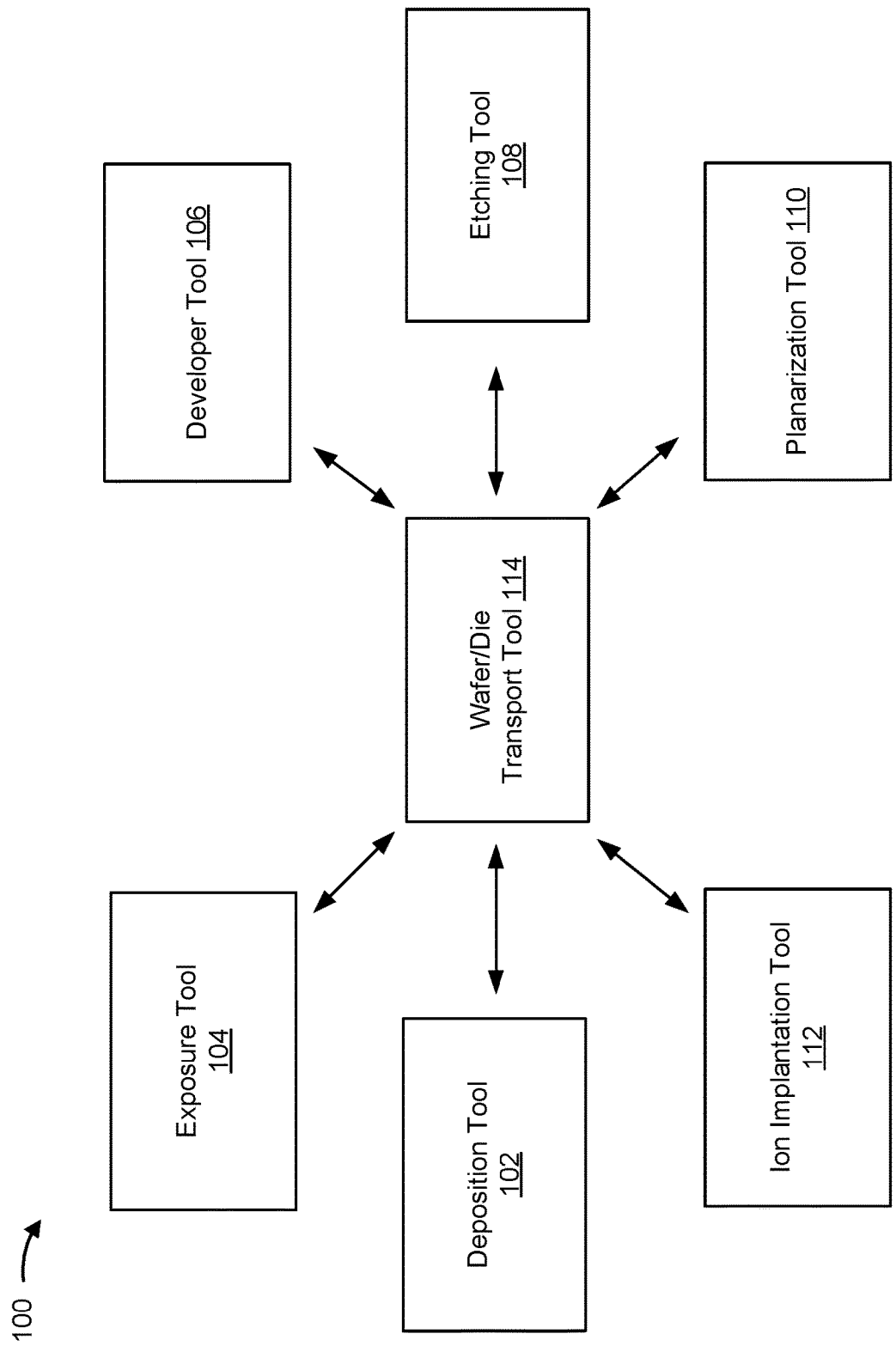
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a complementary metal oxide semiconductor (CMOS) image sensor, incident light received by pixel sensors of the CMOS image sensor is often separated into the three primary colors of visible light: red, green, and blue (RGB). This type of CMOS image sensor may be referred to an RGB image sensor. In an RGB image sensor, respective pixel sensors that sense a particular color of visible light can be defined through the use of a color filter that passes a wavelength range of visible light for a particular color to pass into a photodiode. In low light conditions (e.g., where the availability of visible light is scarce, such as low indoor lighting or at night), RGB image sensors may suffer from poor image quality (e.g., image noise, poor contrast, poor color saturation) because the pixel sensors are not able to capture an adequate amount of red, green, and blue color luminance.

Some implementations described herein provide techniques and apparatuses for a pixel array that includes octagon-shaped pixel sensors and square-shaped pixel sensors. The octagon-shaped pixel sensors may be interspersed in the pixel array with square-shaped pixel sensors to increase the utilization of space in the pixel array, and to allow for pixel sensors in the pixel array to be sized differently. Moreover, the pixel array may include a combination of visible light pixel sensors (e.g., red, green, and blue pixel sensors to obtain color information from incident light; yellow pixel sensors for blue and green color enhancement and correction for the pixel array; and/or white pixel sensors to increase light sensitivity and brightness for the pixel array) and near infrared (NIR) pixel sensors to increase contour sharpness and low light performance for the pixel array. The capability to configure different sizes and types of pixel sensors permits the pixel array to be formed and/or configured to satisfy various performance parameters, such as color saturation, color accuracy, noise, contrast, brightness, hue and saturation, light sensitivity, and contour sharpness.

In some implementations, the pixel array may include an MR cut filter layer for the visible light pixel sensors of the pixel array. Visible light pixel sensors may absorb small amounts of NIR light, which can lead to inaccurate color information and inaccurate images resulting from the inaccurate color information. The MR cut filter layer is included in the pixel array to absorb or reflect MR light for the visible light pixel sensors to reduce (or completely eliminate) the amount of NIR light absorbed by the visible light pixel sensors. The increases the accuracy of the color information provided by the visible light pixel sensors, which can be used to produce more accurate images. In addition, the visible light pixel sensors and/or the MR pixel sensors may include high absorption regions to adjust the orientation of the angle of refraction for the visible light pixel sensors and/or the MR pixel sensors. In this way, the high absorption regions may be used to adjust the angle of incidence to increase the amount of incident light that is absorbed by the visible light pixel sensors and/or the MR pixel sensors, which increases the quantum efficiency of the visible light pixel sensors and/or the MR pixel sensors.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etching tool 108, a planarization tool 110, an ion implantation tool 112, and/or another type of semiconductor processing tool. The plurality of semiconductor processing tools 102-112 included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etching tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of a the substrate using a plasma etch or a plasma-assisted etch, which may involve using an ionized gas to isotopically or directionally etch the one or more portions.

The planarization tool 110 is a semiconductor processing tool that is capable of polishing or planarizing various layers of a wafer or semiconductor device. For example, a polishing device may include a chemical mechanical polishing (CMP) device and/or another type of polishing device. In some implementations, a polishing device may polish or planarize a layer of deposited or plated material.

The ion implantation tool 112 is a semiconductor processing tool that is used to implant ions into a substrate. The ion implantation tool 112 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

Wafer/die transport tool 114 includes a mobile robot, a robot arm, a tram or rail car, and/or another type of device that are used to transport wafers and/or dies between semiconductor processing tools 102-112 and/or to and from other locations such as a wafer rack, a storage room, and/or the like. In some implementations, wafer/die transport tool 114 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
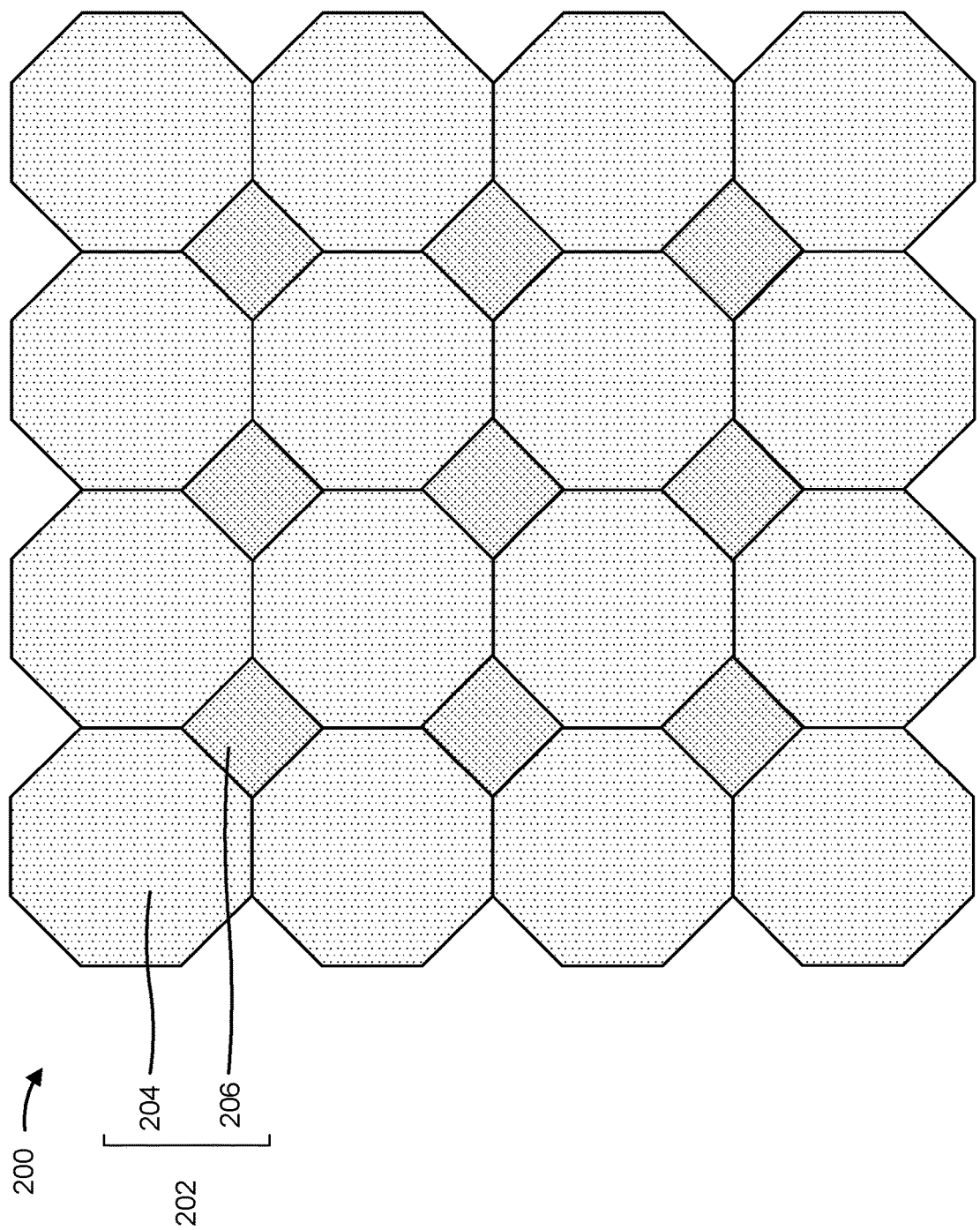
FIG. 2 is a diagram of an example pixel array described herein.

FIG. 2 is a diagram of an example pixel array 200 described herein. In some implementations, the pixel array 200 may be included in an image sensor. The image sensor may be a CMOS image sensor, a backside illumination (BSI) CMOS image sensor, or another type of image sensor. As shown in FIG. 2, the pixel array 200 may include a plurality of pixel sensors 202. The pixel sensors 202 may include a plurality of octagon-shaped pixel sensors 204 and a plurality of square-shaped pixel sensors 206. The octagon-shaped pixel sensors 204 and the square-shaped pixel sensors 206 may be interspersed, intermixed, and/or distributed throughout the pixel array 200.

As shown in FIG. 2, a square-shaped pixel sensor 206 may be disposed between and/or surrounded by a subset of octagon-shaped pixel sensors 204 (e.g., 4 octagon-shaped pixel sensors 204) such that the sides of the octagon-shaped pixel sensors 204 align with the sides of the square-shaped pixel sensors 206. This reduces and/or minimizes unused gaps or portions between the pixel sensors of the pixel array 200, which increases the pixel sensor density of the pixel array 200 and increases spatial utilization in the pixel array 200.

Moreover, this particular arrangement permits the length of the sides of the octagon-shaped pixel sensors 204 to be adjusted to increase or decrease the size of the square-shaped pixel sensors 206 while maintaining the tight grouping of pixel sensors in the pixel array 200. For example, the length of the sides of octagon-shaped pixel sensors 204 facing a square-shaped pixel sensor 206 may be decreased to correspondingly decrease the size of the square-shaped pixel sensor 206. As another example, the length of the sides of octagon-shaped pixel sensors 204 facing a square-shaped pixel sensor 206 may be increased to correspondingly increase the size of the square-shaped pixel sensor 206. In addition, this particular arrangement permits the square-shaped pixel sensors 206 to be used with regular octagon-shaped pixel sensors (e.g., octagon-shaped pixel sensors having all sides the same length) and/or irregular octagon-shaped pixel sensors (e.g., octagon-shaped pixel sensors having two or more sides of different lengths).

As indicated above, FIG. 2 is provided as an example. Other examples may differ from what is described with regard to FIG. 2.

Figure 3A:
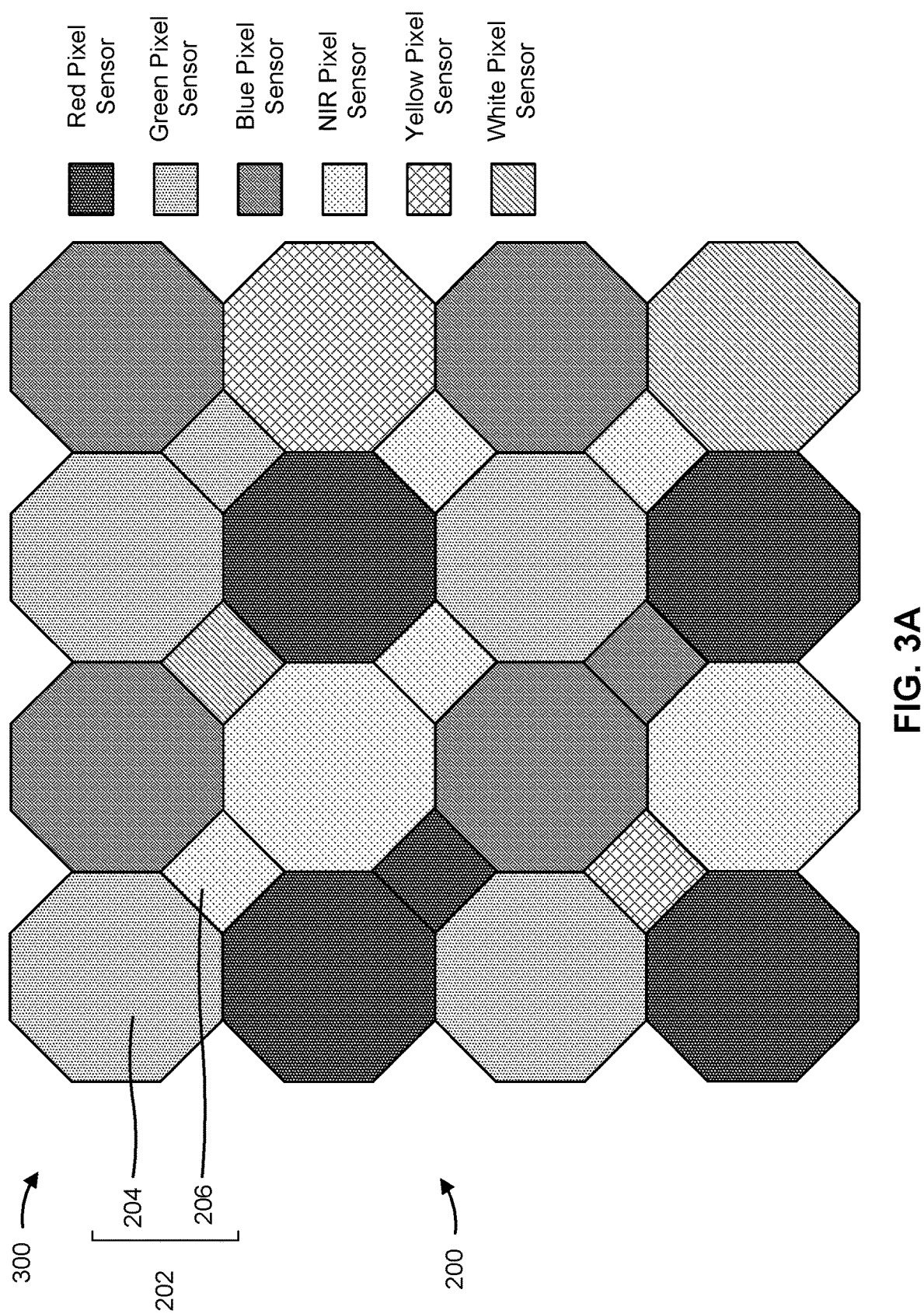
FIGS. 3A, 3B, and 4 are diagrams of example pixel configurations for the example pixel array of FIG. 2.
Figure 3B:
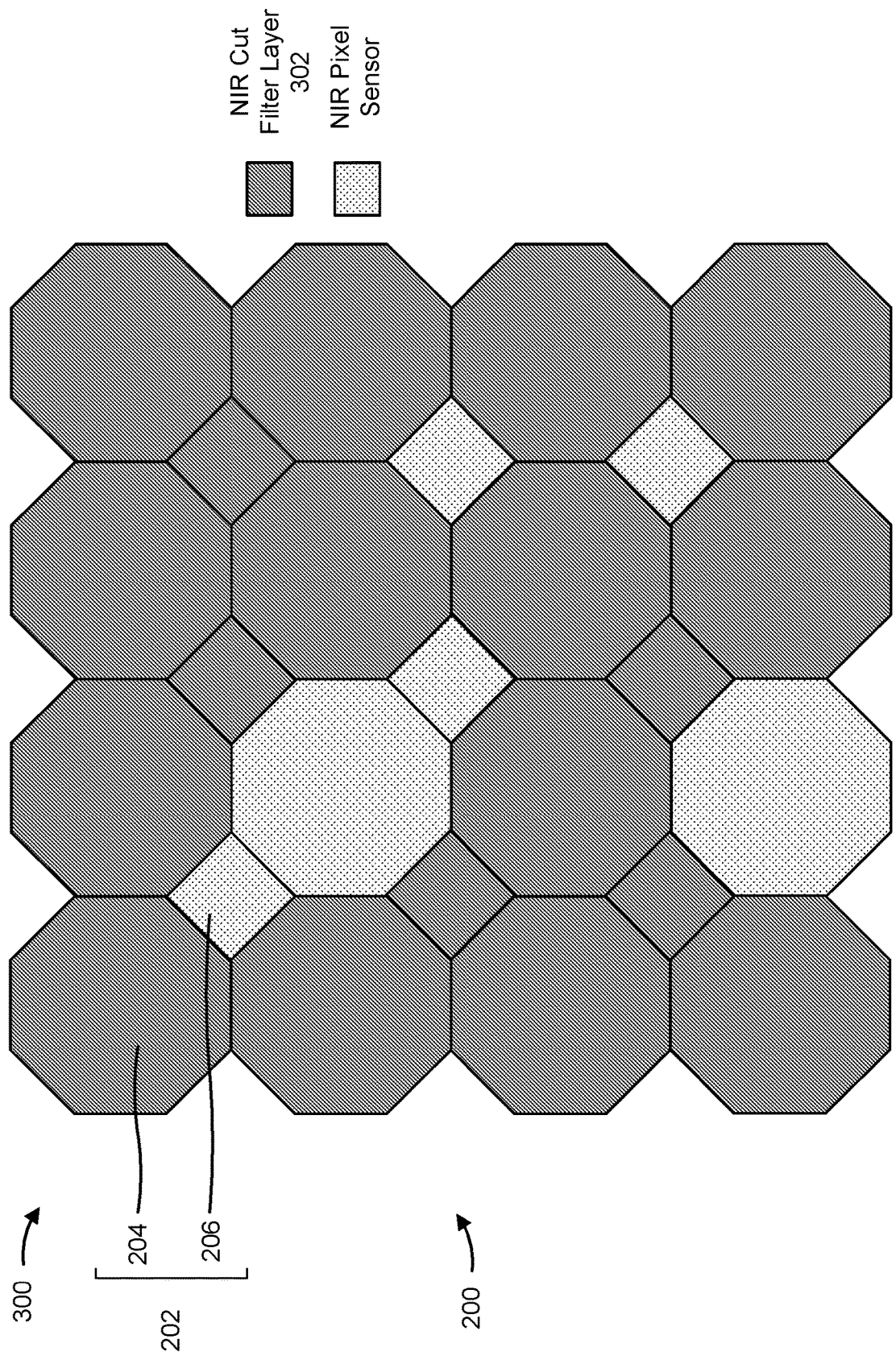

FIGS. 3A and 3B are diagrams of example pixel sensor configurations 300 described herein. In some implementations, the example pixel sensor configurations 300 illustrated in FIGS. 3A and 3B are example pixel sensor configurations for the pixel array 200 or a portion thereof. Other pixel sensor configurations, similar to the example pixel sensor configurations illustrated in FIGS. 3A and 3B, may be used for the pixel array 200 and/or other pixel arrays.

As shown in FIGS. 3A, the pixel sensors 202 of the pixel array 200 may be configured to include a plurality of visible light pixel sensors and a plurality of MR pixel sensors. The plurality of visible light pixel sensors may include one or more red pixel sensors, one or more green pixel sensors, one or more blue pixel sensors, one or more yellow pixel sensors, one or more white pixel sensors, and/or one or more other types of pixel sensors configured to sense incident light in the visible light wavelength range. At least a subset of the visible light pixel sensors may be formed and/or configured to sense a wavelength of incident light associated with a particular color of visible light. For example, a red light pixel sensor may be a visible light pixel sensor that is formed and/or configured to sense a wavelength range of incident light corresponding to a red component of visible light (e.g., to provide red color information for the incident light), a green light pixel sensor may be a visible light pixel sensor that is formed and/or configured to sense a wavelength range of incident light corresponding to a green component of visible light (e.g., to provide green color information for the incident light), and a blue light pixel sensor may be a visible light pixel sensor that is formed and/or configured to sense a wavelength range of incident light corresponding to a blue component of visible light (e.g., to provide blue color information for the incident light). The red pixel sensors, the green pixel sensors, and the blue pixel sensors of the pixel array 200 may be used to sense and obtain color information (e.g., color saturation information, color intensity information, color distribution information, and/or another type of color information) for incident light directed toward the pixel array 200. The color information may be used by various components (e.g., processors, transistors, memory, and/or other components) to interpolate the full visible light color spectrum of the incident light based on a demosaicing algorithm.

The yellow pixel sensors may be visible light pixel sensors that are formed and/or configured to sense a wavelength range of incident light corresponding to a yellow component of visible light (e.g., to provide yellow color information for the incident light). Yellow pixel sensors may have greater quantum efficiency performance relative to green pixel sensors and blue pixel sensors, and thus may be capable of sensing a greater amount of luminance relative to green pixel sensors and blue pixel sensors. The yellow color information obtained by the yellow pixel sensors may be used to interpolate additional green color information and/or blue color information to increase the green light performance and/or the blue light performance of the pixel array 200 and/or the image sensor.

The MR pixel sensors may be formed and/or configured to sense a wavelength of incident light associated with a wavelength of non-visible infrared light near the wavelength range of visible light. For example, an MR pixel sensor may be formed and/or configured to sense a wavelength range of incident light in a range of approximately 700 nanometers to approximately 1400 nanometers. The electromagnetic radiation emitted by the sun includes a greater amount of infrared light than visible light, and the infrared light emitted by the sun is primarily composed of MR light. Accordingly, the MR pixel sensors of the pixel array 200 may be capable of sensing and obtaining a greater amount of luminance information for incident light relative to the visible light pixel sensors. In this way, the MR pixel sensors of the pixel array 200 may be used to increase the light sensitivity of the pixel array, increase the contour sharpness of images generated by the image sensor, and increase the low light performance of the image sensor.

The white pixel sensors may be pixel sensors that are formed and/or configured to sense the entire wavelength range of visible light or substantially the entire wavelength range of visible light. White pixel sensors may be included in the pixel array 200 to provide baseline luminance information, to increase light sensitivity, and/or to increase brightness performance.

As further shown in FIG. 3A, the visible light pixel sensors and/or the MR pixel sensors may be configured in various combinations of the octagon-shaped pixel sensors 204 and square-shaped pixel sensors 206. The arrangement in FIG. 3A is an example, and the visible light pixel sensors and the MR pixel sensors may be arranged in other combinations of octagon-shaped pixel sensors 204 and square-shaped pixel sensors 206. In particular, the red pixel sensor(s) may be configured as octagon-shaped pixel sensors 204 and/or square-shaped pixel sensors 206, the green pixel sensor(s) may be configured as octagon-shaped pixel sensors 204 and/or square-shaped pixel sensors 206, the blue pixel sensor(s) may be configured as octagon-shaped pixel sensors 204 and/or square-shaped pixel sensors 206, the yellow pixel sensor(s) may be configured as octagon-shaped pixel sensors 204 and/or square-shaped pixel sensors 206, the white pixel sensor(s) may be configured as octagon-shaped pixel sensors 204 and/or square-shaped pixel sensors 206, and the MR pixel sensor(s) may be configured as octagon-shaped pixel sensors 204 and/or square-shaped pixel sensors 206.

As shown in FIG. 3B, the pixel array 200 may include an MR cut filter layer 302 over, on, and/or in the visible light pixel sensors (e.g., the red pixel sensor(s), the green pixel sensor(s), the blue pixel sensor(s), the yellow pixel sensor(s), and the white pixel sensor(s)). The MR cut filter layer 302 may function as a cut-off filter that blocks the transmission of the MR component of incident light allowing the visible light component of the incident light to pass through the MR cut filter layer 302 to the underlying visible light pixel sensors. In this way, the MR cut filter layer 302 reduces or eliminates the effect of MR light absorption on the color information and brightness information obtained by the visible light pixel sensors, which increases the accuracy of the color information obtained by the visible light pixel sensors. As further shown in FIG. 3B, the MR cut filter layer 302 may be omitted from the portions of the pixel array 200 including MR pixel sensors to permit the MR component of incident light to be absorbed and/or sensed by the MR pixel sensors.

As indicated above, FIGS. 3A and 3B are provided as examples. Other examples may differ from what is described with regard to FIGS. 3A and 3B. The configuration of the octagon-shaped pixel sensors 204, the configuration of the square-shaped pixel sensors 206, the configuration of the visible light pixel sensors, and/or the configuration of the MR pixel sensors described above in connection with FIGS. 3A and 3B may be arranged according to the examples described above and/or arranged according to other examples to achieve or satisfy one or more performance parameters and/or attributes, such as color saturation, noise, contrast, brightness, hue and saturation, light sensitivity, contour sharpness, image sensor size, pixel sensor density, and/or the like.

As an example, the greater the quantity of octagon-shaped pixel sensors 204 and/or the greater the quantity of square-shaped pixel sensors 206 of the pixel array 200 configured as visible light pixel sensors, the greater the increase in color saturation and the greater the increase hue and saturation may be achieved. Since the octagon-shaped pixel sensors 204 may be of a physically larger size relative to the square-shaped pixel sensors 206, increasing the quantity of the quantity of octagon-shaped pixel sensors 204 configured as visible light pixel sensors may provide larger increases in color saturation and hue and saturation (e.g., because the octagon-shaped pixel sensors 204 may be capable of collecting a greater amount of color information), whereas smaller increases in color saturation and hue and saturation may be achieved by increasing the quantity of square-shaped pixel sensors 206 configured as visible light pixel sensors.

As another example, the greater the quantity of octagon-shaped pixel sensors 204 and/or the greater the quantity of square-shaped pixel sensors 206 of the pixel array 200 configured as MR pixel sensors, the greater the increase contour sharpness increase and the greater the decrease noise may be achieved. Since the octagon-shaped pixel sensors 204 may be of a physically larger size relative to the square-shaped pixel sensors 206, increasing the quantity of the quantity of octagon-shaped pixel sensors 204 configured as MR pixel sensors may provide larger performance increases in contour sharpness and noise (e.g., because the octagon-shaped pixel sensors 204 may be capable of collecting a greater amount of MR light information), whereas smaller performance increases in contour sharpness and noise may be achieved by increasing the quantity of square-shaped pixel sensors 206 configured as MR pixel sensors.

As another example, the greater the quantity of octagon-shaped pixel sensors 204 and/or the greater the quantity of square-shaped pixel sensors 206 of the pixel array 200 configured as yellow pixel sensors, the greater the increase in blue light sensitivity and green light sensitivity may be achieved. Since the octagon-shaped pixel sensors 204 may be of a physically larger size relative to the square-shaped pixel sensors 206, increasing the quantity of the quantity of octagon-shaped pixel sensors 204 configured as yellow pixel sensors may provide larger performance increases in blue light sensitivity and green light sensitivity (e.g., because the octagon-shaped pixel sensors 204 may be capable of collected a greater amount of blue light information and green light information), whereas smaller performance increases in blue light sensitivity and green light sensitivity may be achieved by increasing the quantity of square-shaped pixel sensors 206 configured as yellow pixel sensors.

As another example, the greater the quantity of octagon-shaped pixel sensors 204 and/or the greater the quantity of square-shaped pixel sensors 206 of the pixel array 200 configured as white pixel sensors, the greater the increase in contrast and brightness may be achieved. Since the octagon-shaped pixel sensors 204 may be of a physically larger size relative to the square-shaped pixel sensors 206, increasing the quantity of the quantity of octagon-shaped pixel sensors 204 configured as white pixel sensors may provide larger performance increases in contrast and brightness (e.g., because the octagon-shaped pixel sensors 204 may be capable of collected a greater amount of luminance information that can be used to establish a baseline luminance), whereas smaller performance increases in contrast and brightness may be achieved by increasing the quantity of square-shaped pixel sensors 206 configured as white pixel sensors.

Figure 4:
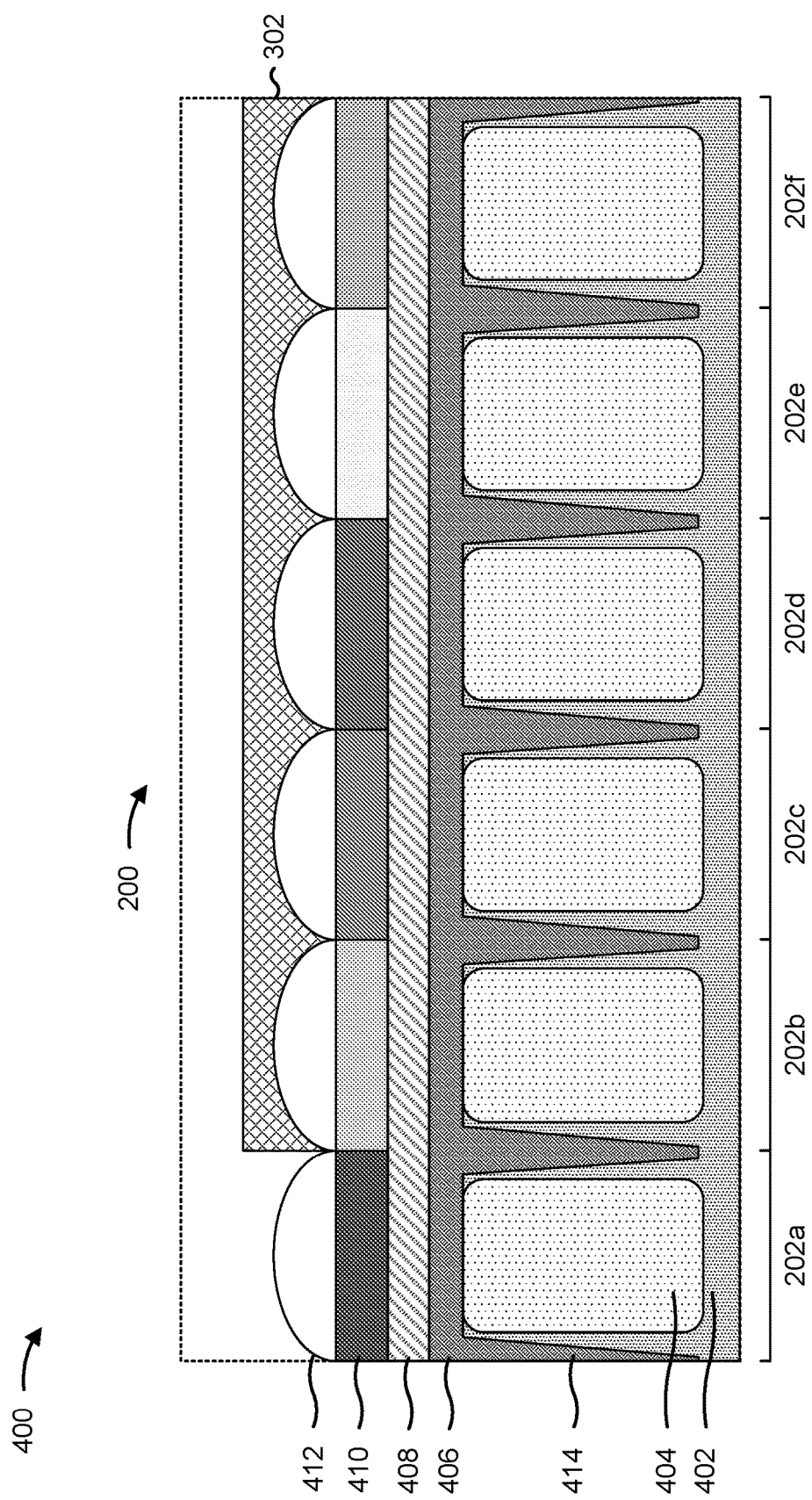

FIG. 4 is a diagram of an example pixel sensor configuration 400 described herein. In some implementations, the example pixel sensor configuration 400 illustrated in FIG. 4 is a cross-sectional view of an example pixel sensor configuration for the pixel array 200 or a portion thereof. Other pixel sensor configurations similar to the example pixel sensor configuration 400 illustrated in FIG. 4 may be used for the pixel array 200 and/or other pixel arrays.

As shown in FIG. 4, the pixel array 200 may include a plurality of adjacent pixel sensors 202, such as pixel sensors 202a-202f. The pixel sensors 202a-202f may be configured as octagon-shaped pixel sensors 204, square-shaped pixel sensors 206, or a combination thereof. As further shown in FIG. 4, each of the pixel sensors 202 may be formed in a substrate 402, which may include a semiconductor die substrate, a semiconductor wafer, or another type of substrate in which semiconductor pixels may be formed. In some implementations, the substrate 402 is formed of silicon, a material including silicon, a III-V compound semiconductor material such as gallium arsenide (GaAs), a silicon on insulator (SOI), or another type of semiconductor material that is capable of generating a charge from photons of incident light.

Each pixel sensor 202 may include a photodiode 404. A photodiode 404 may include a region of the substrate 402 that is doped with a plurality of types of ions to form a p-n junction or a PIN junction (e.g., a junction between a p-type portion, an intrinsic (or undoped) type portion, and an n-type portion). For example, the substrate 402 may be doped with an n-type dopant to form a first portion (e.g., an n-type portion) of a photodiode 404 and a p-type dopant to form a second portion (e.g., a p-type portion) of the photodiode 404. A photodiode 404 may be configured to absorb photons of incident light. The absorption of photons causes a photodiode 404 to accumulate a charge (referred to as a photocurrent) due to the photoelectric effect. Here, photons bombard the photodiode 404, which causes emission of electrons of the photodiode 404. The emission of electrons causes the formation of electron-hole pairs, where the electrons migrate toward the cathode of the photodiode 404 and the holes migrate toward the anode, which produces the photocurrent.

The pixel array 200 may include an oxide layer 406 above and/or on the substrate 402 and the photodiodes 404. The oxide layer 406 may function as a passivation layer between the photodiodes 404 and the upper layers of the pixel array 200. In some implementations, the oxide layer 406 includes an oxide material such as a silicon oxide ($SiO_x$). In some implementations, a silicon nitride ($SiN_x$), a silicon carbide ($SiC_x$), or a mixture thereof, such as a silicon carbon nitride (SiCN), a silicon oxynitride (SiON), or another dielectric material is used in place of the oxide layer 406 as a passivation layer.

The pixel array 200 may include an antireflective coating layer 408 above and/or on the oxide layer 406. The antireflective coating layer 408 may include a suitable material for reducing a reflection of incident light projected toward the photodiodes 404. For example, the antireflective coating layer 408 may include nitrogen-containing material. In some implementations, a semiconductor processing tool (e.g., deposition tool 102) may form the antireflective coating layer 408 to a thickness in a range from approximately 200 angstroms to approximately 1000 angstroms.

The pixel array 200 may include a filter layer 410 above and/or on the antireflective coating layer 408. The filter layer 410 may include an array of filter regions, where a subset of the filter regions is configured to filter incident light to allow a particular wavelength of the incident light to pass to a photodiode 404 of an associated pixel sensor 202. For example, a filter region included in the pixel sensor 202b may filter red light for the pixel sensor 202b (and thus, the pixel sensor 202b may be a red pixel sensor), the filter region included in the pixel sensor 202c may filter green light for the pixel sensor 202c (and thus, the pixel sensor 202c may be a green pixel sensor), the filter region included in the pixel sensor 202d may filter blue light for the pixel sensor 202d (and thus, the pixel sensor 202d may be a blue pixel sensor), the filter region included in the pixel sensor 202e may filter yellow light for the pixel sensor 202e (and thus, the pixel sensor 202e may be a yellow pixel sensor), and so on.

A blue filter region may permit the component of incident light near a 450 nanometer wavelength to pass through the filter layer 410 and blocks other wavelengths from passing. A green filter region that permits the component of incident light near a 550 nanometer wavelength to pass through the filter layer 410 and blocks other wavelengths from passing. A red filter region that permits the component of incident light near a 650 nanometer wavelength to pass through the filter layer 410 and blocks other wavelengths from passing. A yellow filter region that permits the component of incident light near a 580 nanometer wavelength to pass through the filter layer 410 and blocks other wavelengths from passing.

In some implementations, the filter layer 410 includes one or more non-discriminating or non-filtering regions in one or more white pixel sensors (e.g., pixel sensor 202f). A non-discriminating or non-filtering region may include a material that permits all wavelengths of light to pass into the associated photodiode 404 (e.g., for purposes of determining overall brightness to increase light sensitivity for the image sensor). In some implementations, the filter layer 410 includes one or more MR bandpass filter regions included in one or more MR pixel sensors (e.g., pixel sensor 202a). An MR bandpass filter region may include a material that permits the portion of incident light in an MR wavelength range to pass while blocking visible light from passing.

As further shown in FIG. 4, the pixel array 200 may include a micro-lens layer 412 above and/or on the filter layer 410. The micro-lens layer 412 may include a micro-lens for each of the pixel sensors 202. For example, a micro-lens may be formed to focus incident light toward the photodiode 404 of the pixel sensor 202a, another micro-lens may be formed to focus incident light toward the photodiode 404 of the pixel sensor 202b, another micro-lens may be formed to focus incident light toward the photodiode 404 of the pixel sensor 202c, and so on.

In some implementations, the image sensor is a BSI CMOS image sensor. In these examples, the oxide layer 406, the antireflective coating layer 408, the filter layer 410, and the micro-lens layer 412 may be formed on a backside of the substrate 402. Moreover, one or more deep trench isolation (DTI) structures 414 may be formed in the backside of the substrate 402 to provide optical isolation between the pixel sensors 202, and thus may be referred to as backside DTI (BDTI) structures. The DTI structure(s) 414 may be trenches (e.g., deep trenches) that are filled with a material (e.g., an oxide material such as a silicon oxide ($SiO_x$) or another dielectric material) and provide optical isolation between the pixel sensors 202. The DTI structure(s) 414 may be formed in a grid layout in which the DTI structure(s) 414 extend laterally across the pixel array and intersect at various locations of the pixel array.

As further shown in FIG. 4, the pixel array 200 may include an MR cut filter layer 302 over and/or on the micro-lens layer 412. The NIR cut filter layer 302 may be formed on and/or over the portion(s) of the micro-lens layer 412 included in the visible light pixel sensors of the pixel array 200. For example, the MR cut filter layer 302 may be formed on and/or over a portion of the micro-lens layer 412 included in pixel sensors 202b-202f. The MR cut filter layer 302 may be omitted from the portion(s) of the micro-lens layer 412 included in the MR pixel sensors of the pixel array 200. For example, the MR cut filter layer 302 may be omitted from the portion of the micro-lens layer 412 included in pixel sensor 202a to permit the MR component of incident light to pass to the photodiode 404 of the pixel sensor 202a.

As indicated above, FIG. 4 is provided as an example. Other examples may differ from what is described with regard to FIG. 4. The configuration of the layers of the pixel array 200, the configuration of the visible light pixel sensors, and/or the configuration of the MR pixel sensors described above in connection with FIG. 4 may be arranged according to the examples described above and/or arranged according to other examples to achieve or satisfy one or more performance parameters and/or attributes, such as color saturation, noise, contrast, brightness, hue and saturation, light sensitivity, contour sharpness, image sensor size, pixel sensor density, and/or the like.

Figure 5A:
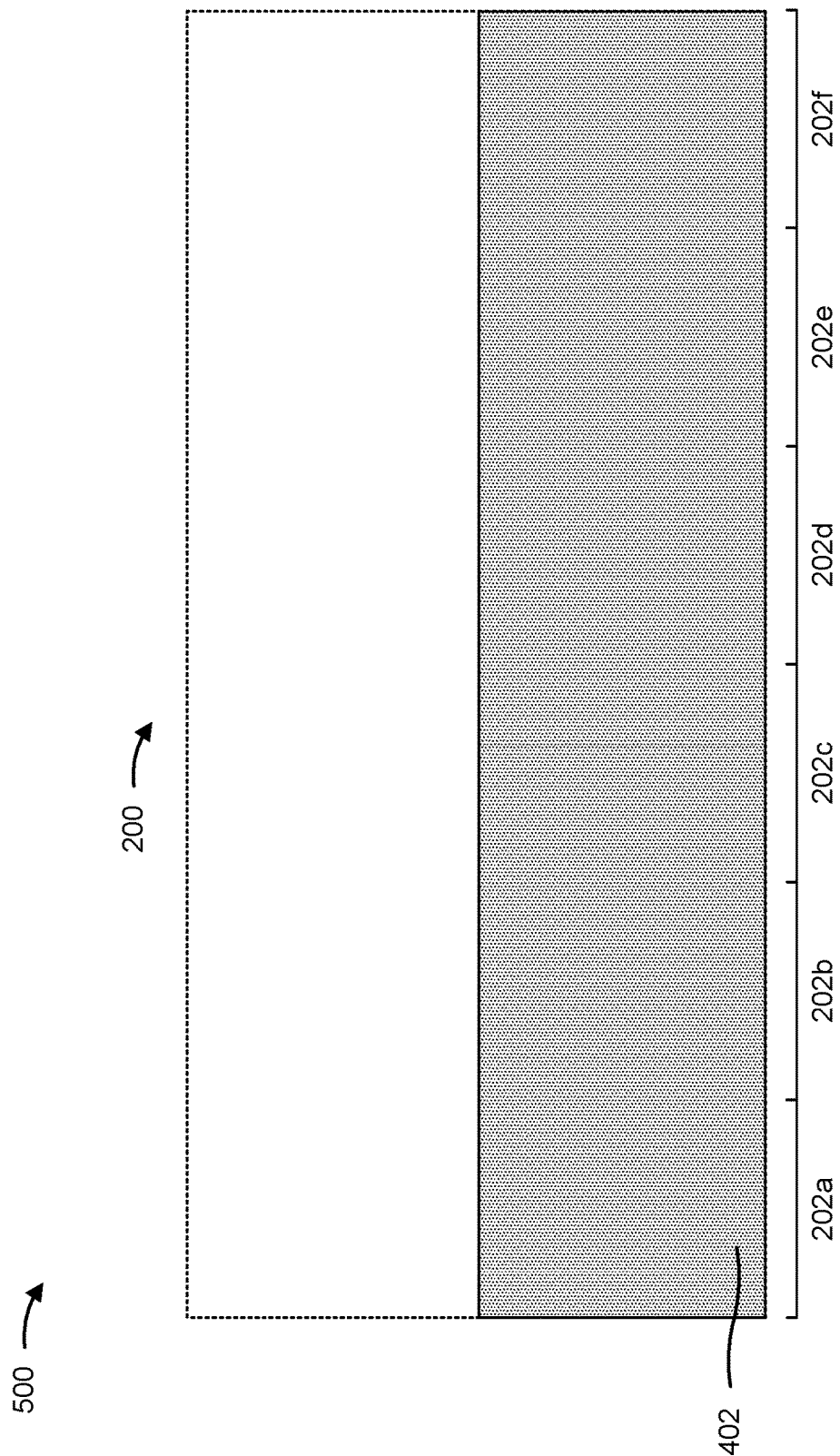
FIGS. 5A-5H are diagrams of an example implementation described herein.

FIGS. 5A-5H are diagrams of an example 500 of forming a pixel array. In particular, FIGS. 5A-5H illustrate cross-sectional views of an example of forming the pixel array 200 in which the pixel array 200 includes the pixel sensor configuration illustrated and described above in connection with FIG. 4. The pixel array 200 may be formed as part of an image sensor (e.g., a CMOS image sensor, a BSI CMOS image sensor) manufacturing process. As shown in FIG. 5A, the pixel array 200 may be formed in the substrate 402. As described above, the substrate 402 may be a semiconductor die (or a portion thereof), a semiconductor wafer (or a portion thereof), or another type of substrate in which pixel arrays may be formed.

Figure 5B:
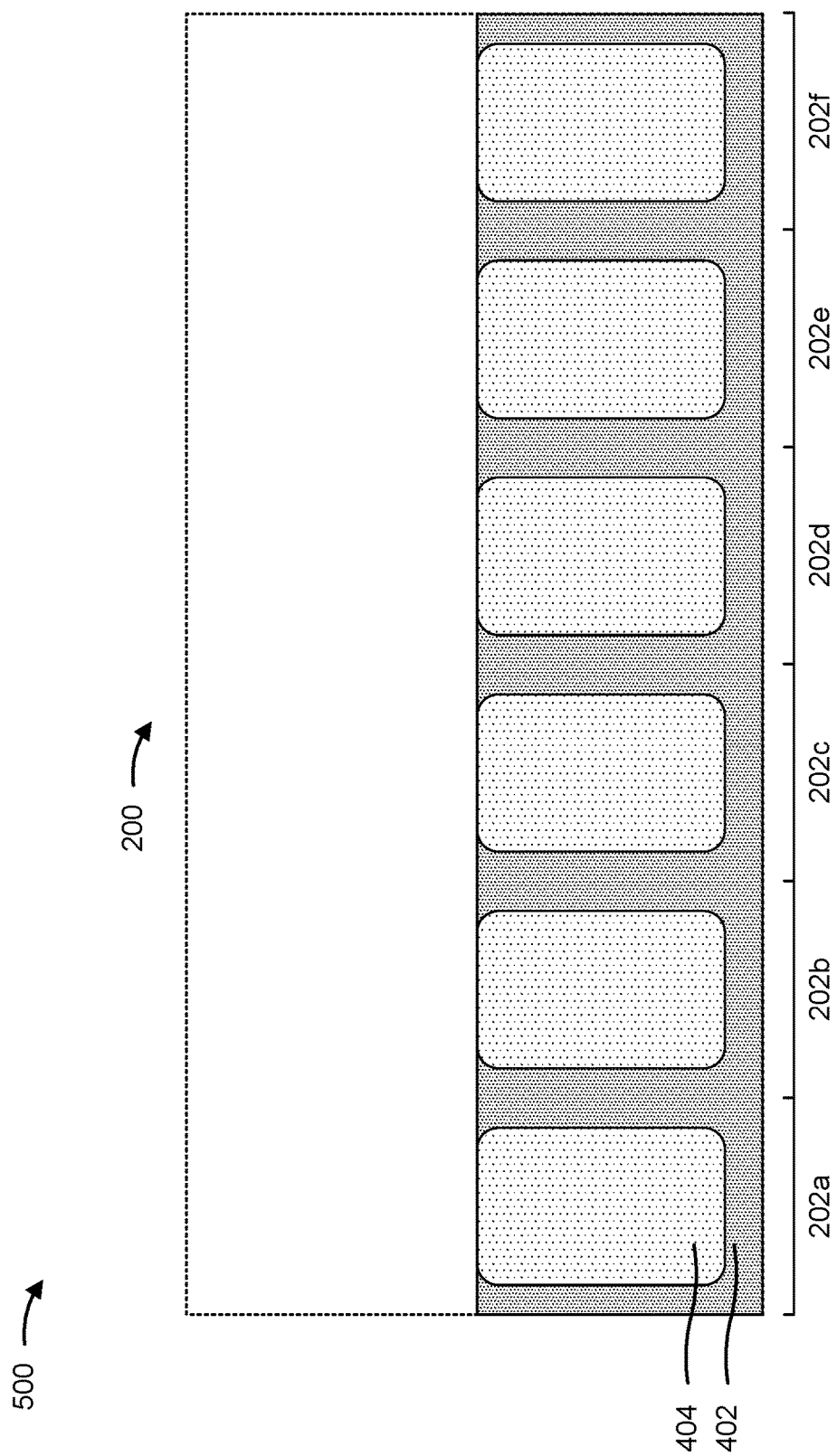

As shown in FIG. 5B, a plurality of pixel sensors 202 of the pixel array 200 may be formed in the substrate 402. For example, a pixel sensor 202a may be formed by doping a portion of the substrate 402, a pixel sensor 202b may be formed by doping another portion of the substrate 402, a pixel region sensor may be formed by doping another portion of the substrate 402, and so on. Some of the pixel sensors 202 may be octagon-shaped pixel sensors 204 and/or some of the pixel sensors 202 may be square-shaped pixel sensors 206.

In some implementations, a semiconductor processing tool such as the ion implantation tool 112 dopes the portions of the substrate 402 using an ion implantation technique to form a photodiode 404 in each of the pixel sensors 202. In these examples, the semiconductor processing tool may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. In some implementations, other techniques and/or types of ion implantation tools are used to form the ion beam. The ion beam may be directed at the pixel sensors 202 to implant ions in the substrate 402, thereby doping the substrate 402 to form the photodiodes 404 in each of the pixel sensors 202.

The substrate 402 may be doped with a plurality of types of ions to form a p-n junction for each photodiode 404. For example, the substrate 402 may be doped with an n-type dopant to form a first portion (e.g., an n-type portion) of a photodiode 404 and a p-type dopant to form a second portion (e.g., a p-type portion) of the photodiode 404.

Figure 5C:
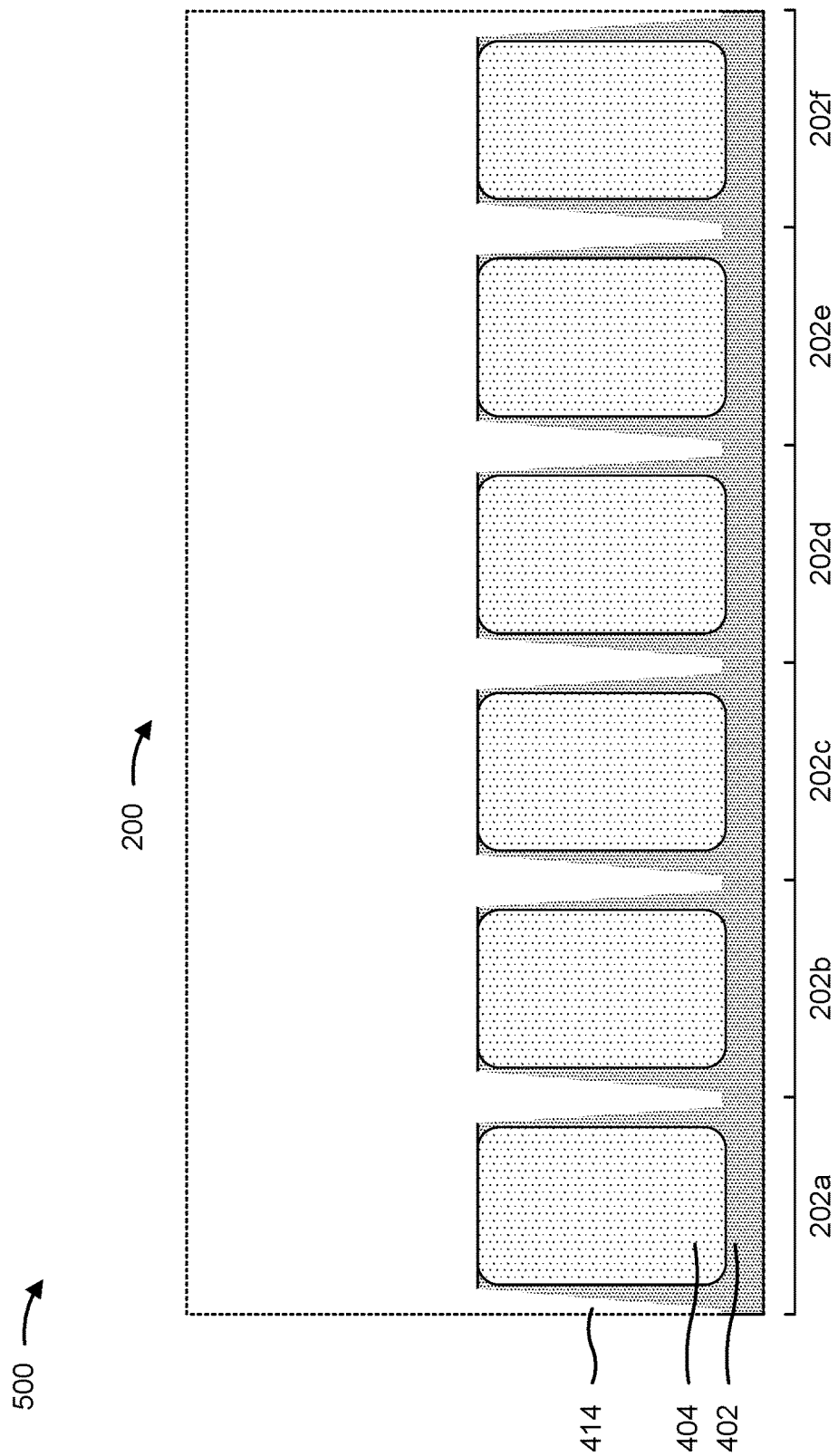

As shown in FIG. 5C, DTI structures 414 may be formed in the substrate 402. In particular, a DTI structure 414 may be formed on each side of the photodiodes 404 of the pixel sensors 202. As an example, DTI structures 414 may be formed on each side of the photodiode 404 of the pixel sensor 202a, DTI structures 414 may be formed on each side of the photodiode 404 of the pixel sensor 202b, DTI structures 414 may be formed on each side of the photodiode 404 of the pixel sensor 202c, and so on. In some implementations, if the pixel array 200 is a BSI pixel array, the DTI structure(s) 414 may be BDTI structures formed in a backside of the substrate 402.

In some implementations, one or more semiconductor processing tools may be used to form the one or more DTI structures 414 in the substrate 402. For example, the deposition tool 102 may form a photoresist layer on the substrate 402, the exposure tool 104 may expose the photoresist layer to a radiation source to pattern the photoresist layer, the developer tool 106 may develop and remove portions of the photoresist layer to expose the pattern, and the etch tool 108 may etch the one or more portions of substrate 402 to form the one or more DTI structures 414 in the substrate 402. In some implementations, a photoresist removal tool removes the remaining portions of the photoresist layer (e.g., using a chemical stripper and/or another technique) after the etch tool 108 etches the substrate 402.

Figure 5D:
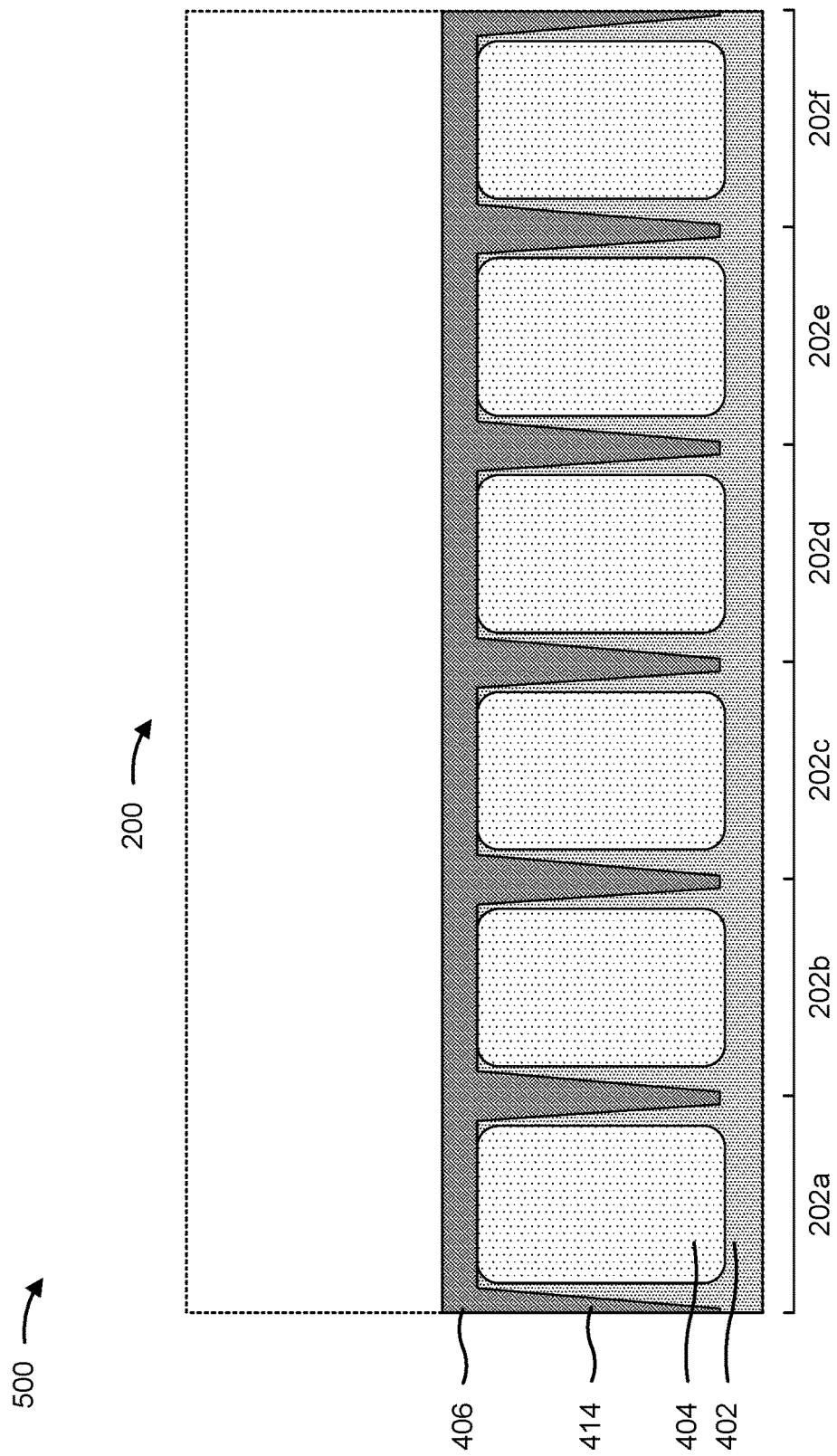

As shown in FIG. 5D, the DTI structures 414 may each be filled with a material. In particular, a semiconductor processing tool (e.g., the deposition tool 102) may deposit an oxide material (e.g., a silicon oxide ($SiO_x$) or another type of oxide) in each of the one or more DTI structures 414. A semiconductor processing tool (e.g., the deposition tool 102) may further deposit the oxide material on the substrate 402 and one or more photodiodes 404 to form the oxide layer 406. The oxide layer 406 may function as a passivation layer. In some implementations, a silicon nitride ($SiN_x$), a silicon carbide ($SiC_x$), or a mixture thereof, such as a silicon carbon nitride (SiCN), a silicon oxynitride (SiON), or another dielectric material may be used in place of the oxide layer 406 as a passivation layer.

A semiconductor processing tool (e.g., the planarization tool 110) may polish or planarize the oxide layer 406 to flatten the oxide layer 406 in preparation for the deposition of additional layers and/or structures on the oxide layer 406. The oxide layer 406 may be planarized using a polishing or planarizing technique such as CMP. A CMP process may include depositing a slurry (or polishing compound) onto a polishing pad. The semiconductor die or wafer in which the pixel array 200 is formed may be mounted to a carrier, which may rotate the semiconductor die or wafer as the semiconductor die or wafer is pressed against the polishing pad. The slurry and polishing pad act as an abrasive that polishes or planarizes the oxide layer 406 as the semiconductor die or wafer is rotated. The polishing pad may also be rotated to ensure a continuous supply of slurry is applied to the polishing pad.

Figure 5E:
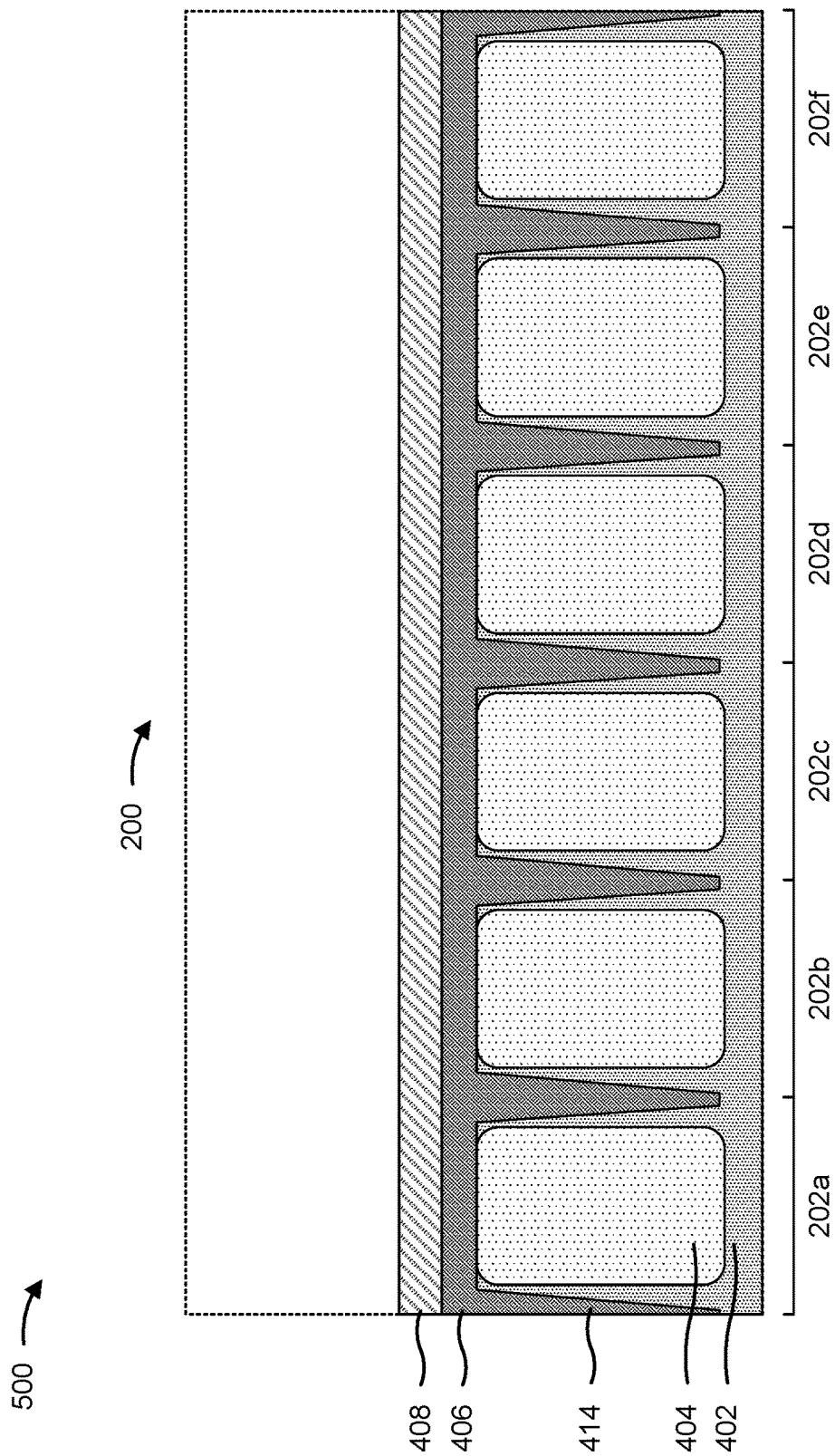

As shown in FIG. 5E, the antireflective coating layer 408 may be formed above and/or on the oxide layer 406. In particular, a semiconductor processing tool (e.g., the deposition tool 102) may deposit the antireflective coating layer 408 using a CVD technique, a PVD technique, an ALD technique, or another type of deposition technique. The antireflective coating layer 408 may include a suitable material for reducing a reflection of incident light projected toward the photodiodes 404. For example, the antireflective coating layer 408 may include nitrogen-containing material. In some implementations, the semiconductor processing tool may form the antireflective coating layer 408 to a thickness in a range from approximately 200 angstroms to approximately 1000 angstroms.

Figure 5F:
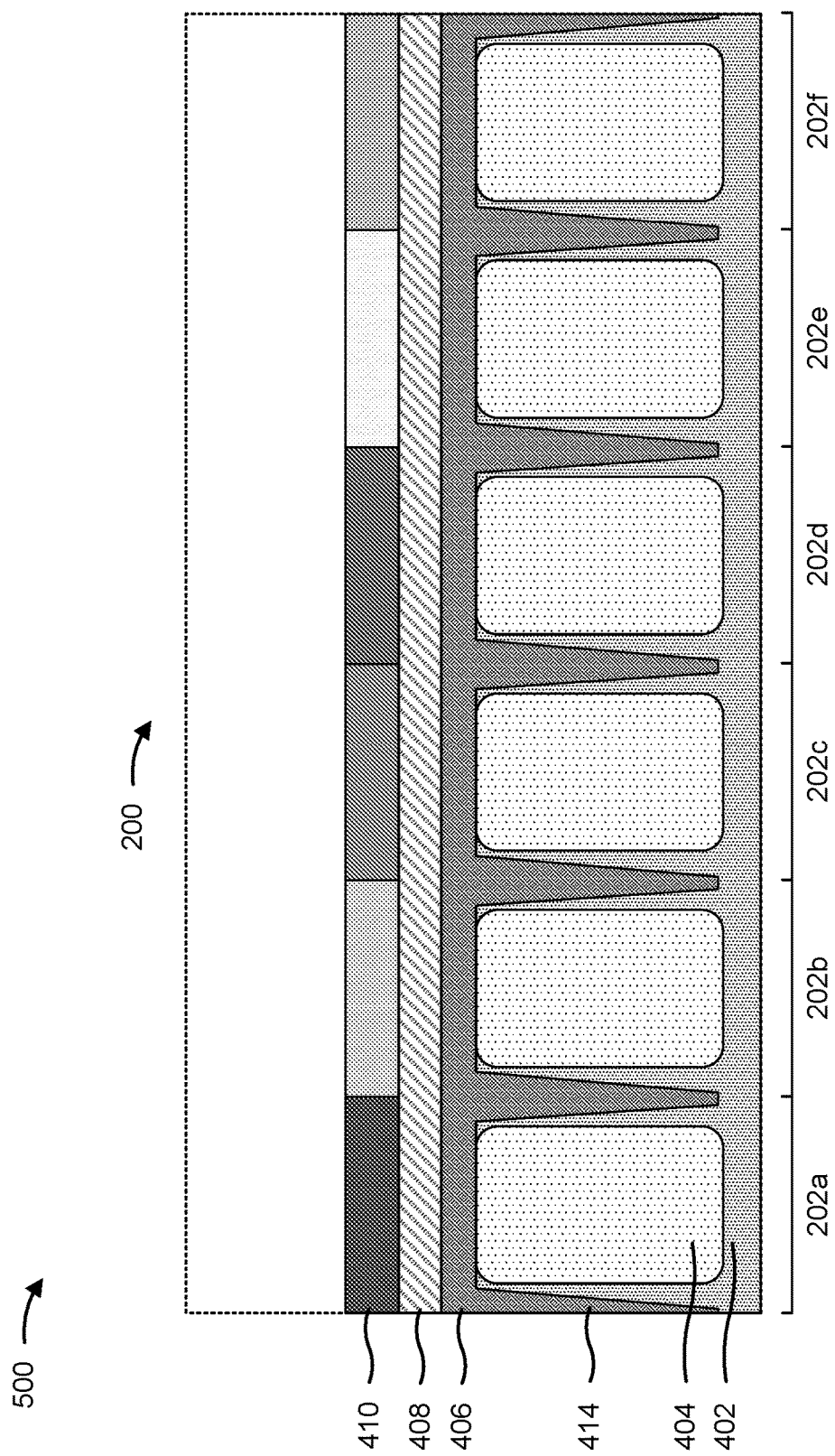

As shown in FIG. 5F, the filter layer 410 may be formed above and/or over the antireflective coating layer 408. In some implementations, a semiconductor processing tool (e.g., the deposition tool 102) deposits the filter layer 410 using a CVD technique, a PVD technique, an ALD technique, or another type of deposition technique. In some implementations, the filter layer 410 is a layer that is bonded to the pixel array 200.

Figure 5G:
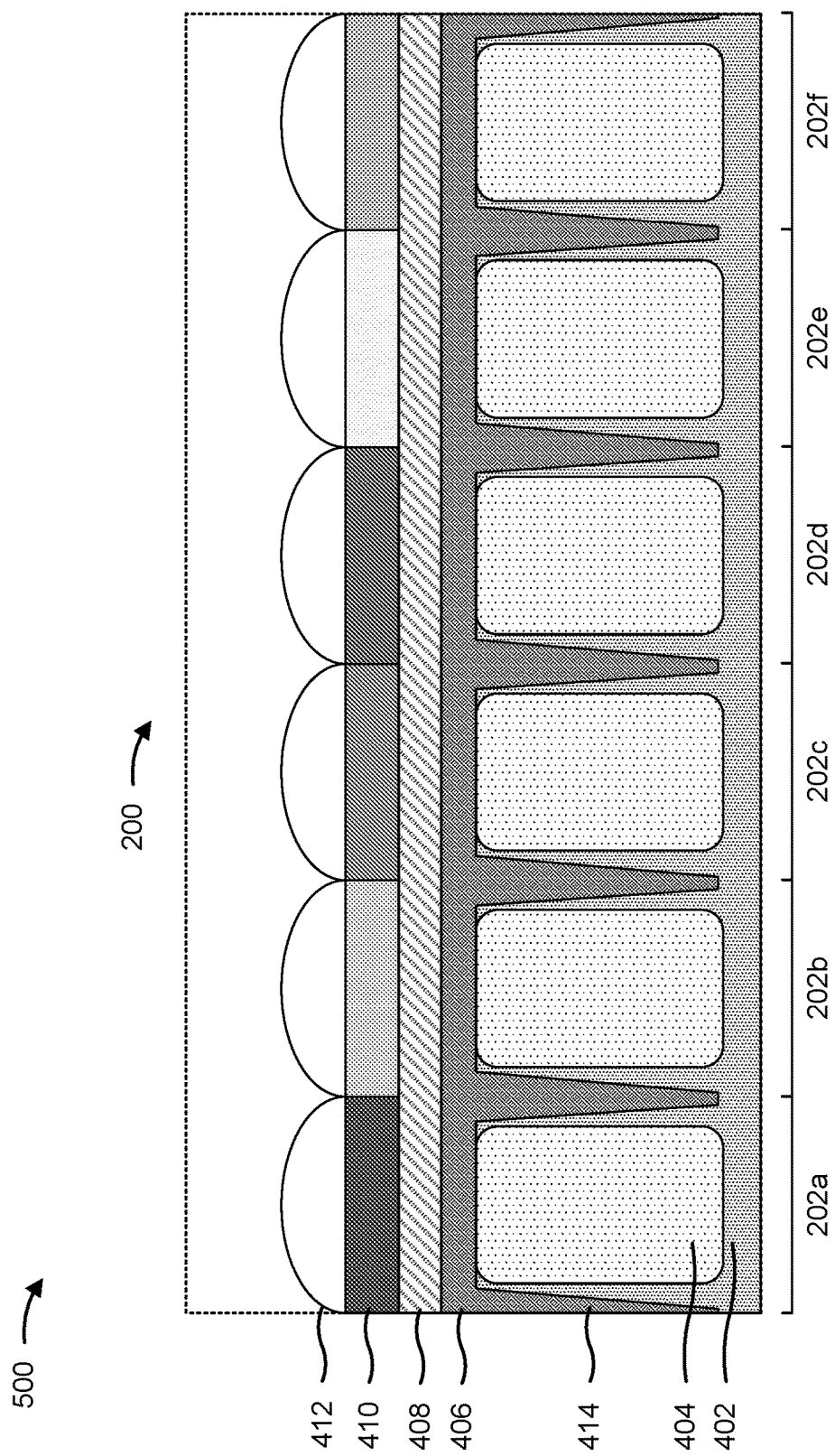

As shown in FIG. 5G, a micro-lens layer 412 may be formed above and/or on the filter array 410. The micro-lens layer 412 may be formed such that each micro-lens in the micro lens layer 412 is formed over an associated pixel sensor 202. For example, the micro-lens layer 412 may be formed such that a micro-lens is formed over the pixel sensor 202a, such that another micro-lens is formed over the pixel sensor 202b, such that another micro-lens is formed over the pixel sensor 202c, and so on. The micro-lens layer 412 may, for example, be formed by a spin-on process or a deposition process and a reflow operation to curve upper or top surfaces of the micro-lenses.

Figure 5H:
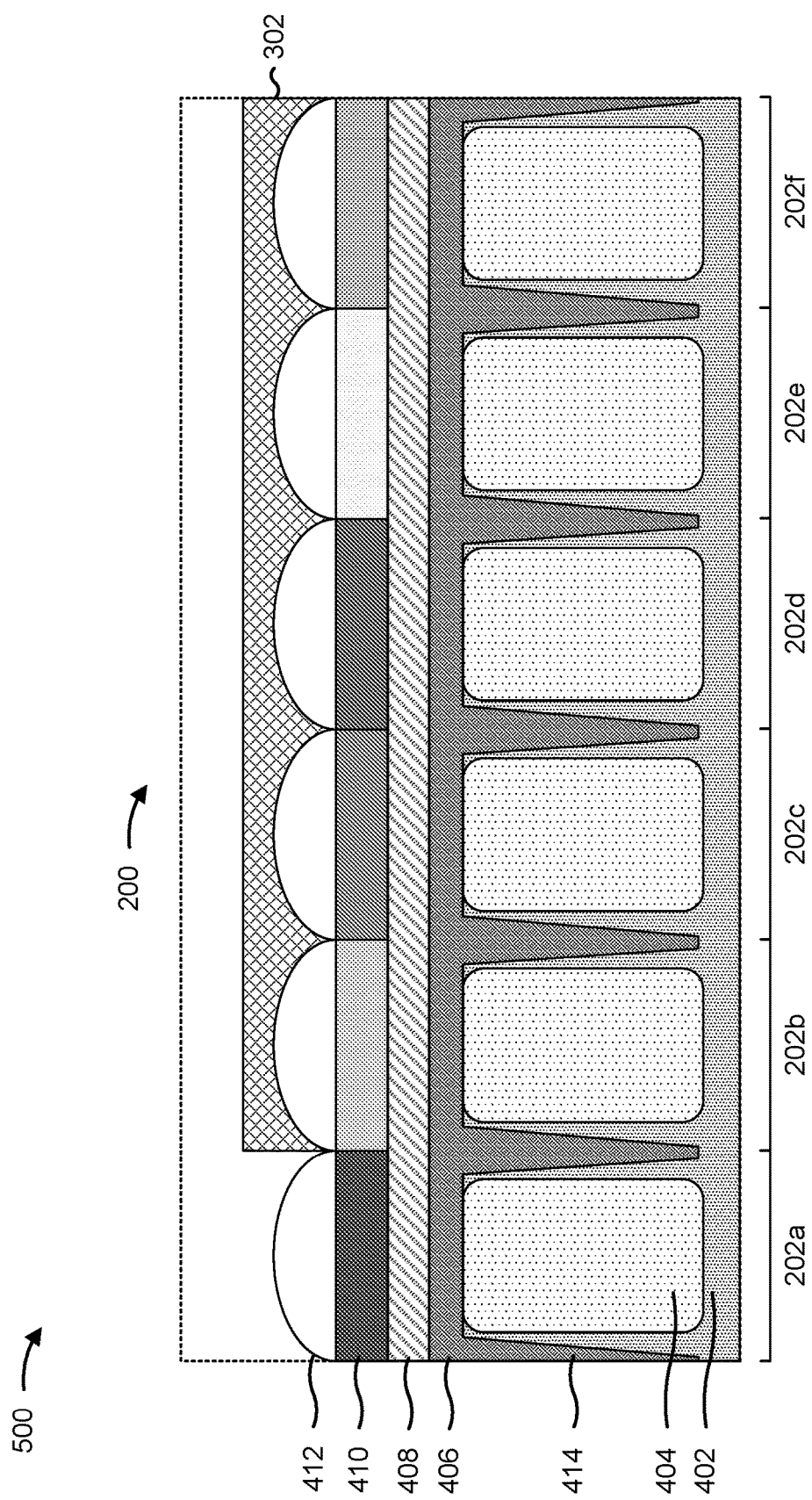

As shown in FIG. 5H, the MR cut filter layer 302 may be formed above and/or on the micro-lens layer 412. In particular, the MR cut filter layer 302 may be formed above and/or on the portion of the micro-lens layer 412 included in the visible light pixel sensors (e.g., pixel sensors 202b-202f) of the pixel array 200. One or more semiconductor processing tools may be used to form the NIR cut filter layer 302. For example, the deposition tool 102 may form a photoresist layer on the micro-lens layer 412, the exposure tool 104 may expose the photoresist layer to a radiation source to pattern the photoresist layer, the developer tool 106 may develop and remove portions of the photoresist layer to expose the pattern. The one or more semiconductor processing tools may form the pattern in the photoresist to block or prevent the MR cut filter layer 302 from being formed above and/or on the portion of the micro-lens layer 412 included in the MR pixel sensors (e.g., the pixel sensor 202a) of the pixel array 200.

In some implementations, a semiconductor processing tool (e.g., the deposition tool 102) deposits the MR cut filter layer 302 based on the pattern formed in the photoresist layer using a CVD technique, a PVD technique, an ALD technique, or another type of deposition technique. The MR cut filter layer 302 may be formed to a suitable thickness to absorb or reflect the NIR component of incident light such that the MR component of the incident light is blocked from passing to the photodiodes 404 of the underlying visible light pixel sensors.

As indicated above, FIGS. 5A-5H are provided as an example. Other examples may differ from what is described with regard to FIGS. 5A-5H.

Figure 6:
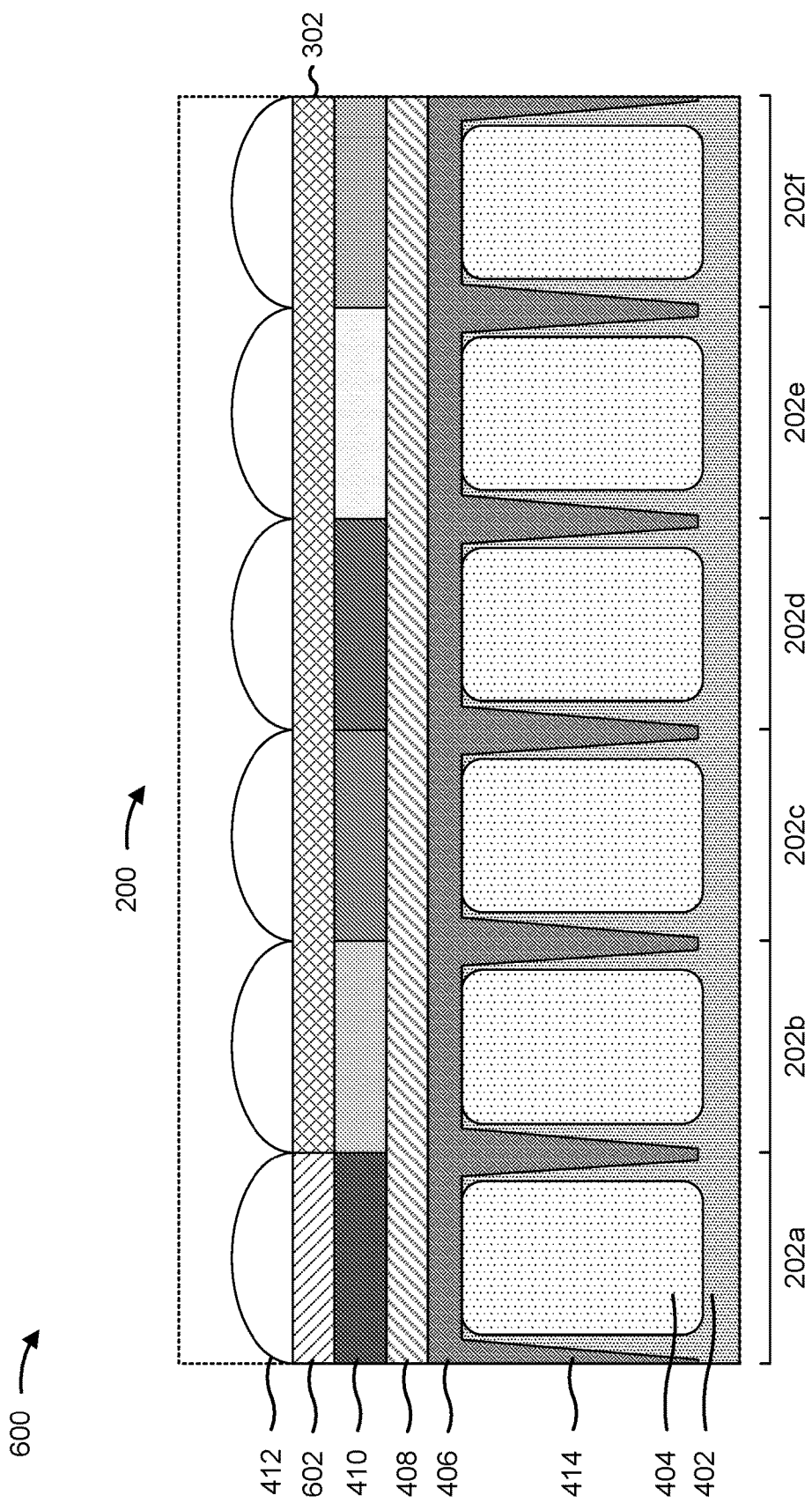
FIG. 6 is a diagram of example pixel configuration for the example pixel array of FIG. 2.

FIG. 6 is a diagram of an example pixel sensor configuration 600 described herein. In some implementations, the example pixel sensor configuration 600 illustrated in FIG. 6 is a cross-sectional view of an example pixel sensor configuration for the pixel array 200 or a portion thereof. Other pixel sensor configurations similar to the example pixel sensor configuration 600 illustrated in FIG. 6 may be used for the pixel array 200 and/or other pixel arrays.

As shown in FIG. 6, the pixel array 200 may include the plurality of pixel sensors 202 (e.g., pixel sensors 202a-202f), the substrate 402, the plurality of photodiodes 404, the oxide layer 406, the antireflective coating layer 408, the filter layer 410, the micro-lens layer 412, the DTI structures 414, and the MR cut filter layer 302. In the example pixel sensor configuration 600 illustrated in FIG. 6, the MR cut filter layer 302 is located above and/or on the filter layer 410, and below the micro-lens layer 412. The micro-lens layer 412 is located above and/or on the MR cut filter layer 302. A passivation layer 602 may be included in the MR pixel sensors (e.g., the pixel sensor 202a) to provide a substantially flat layer composed, of the passivation layer 602 and the MR cut filter layer 302, on which the micro-lens layer 412 may be formed. The passivation layer 602 may be formed of a substantially optically clear material such that incident light is permitted to pass through the passivation layer 602.

As indicated above, FIG. 6 is provided as an example. Other examples may differ from what is described with regard to FIG. 6. The configuration of the layers of the pixel array 200, the configuration of the visible light pixel sensors, and/or the configuration of the MR pixel sensors described above in connection with FIG. 6 may be arranged according to the examples described above and/or arranged according to other examples to achieve or satisfy one or more performance parameters and/or attributes, such as color saturation, noise, contrast, brightness, hue and saturation, light sensitivity, contour sharpness, image sensor size, pixel sensor density, and/or the like.

Figure 7A:
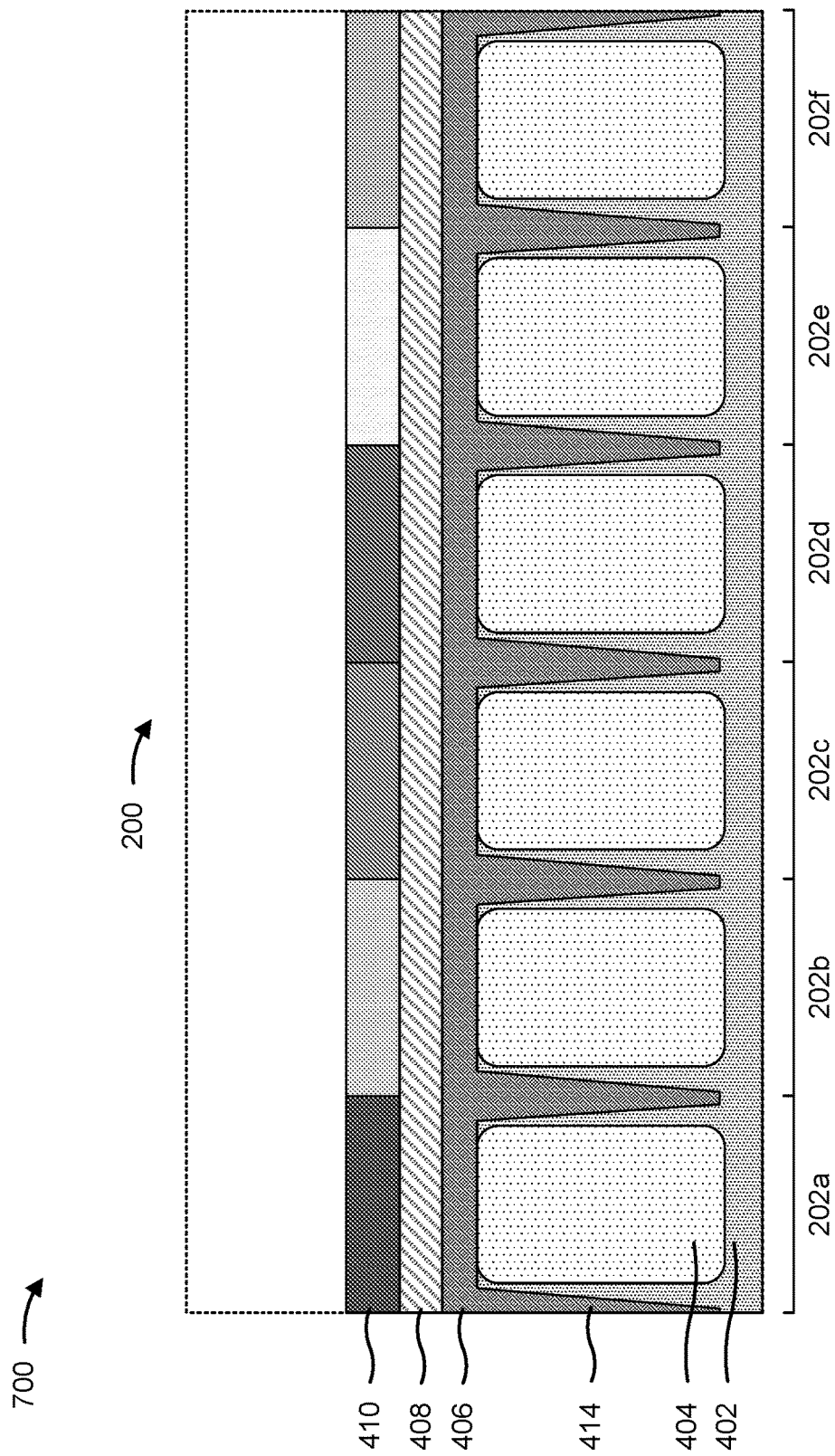
FIGS. 7A-7C are diagrams of an example implementation described herein.
Figure 7B:
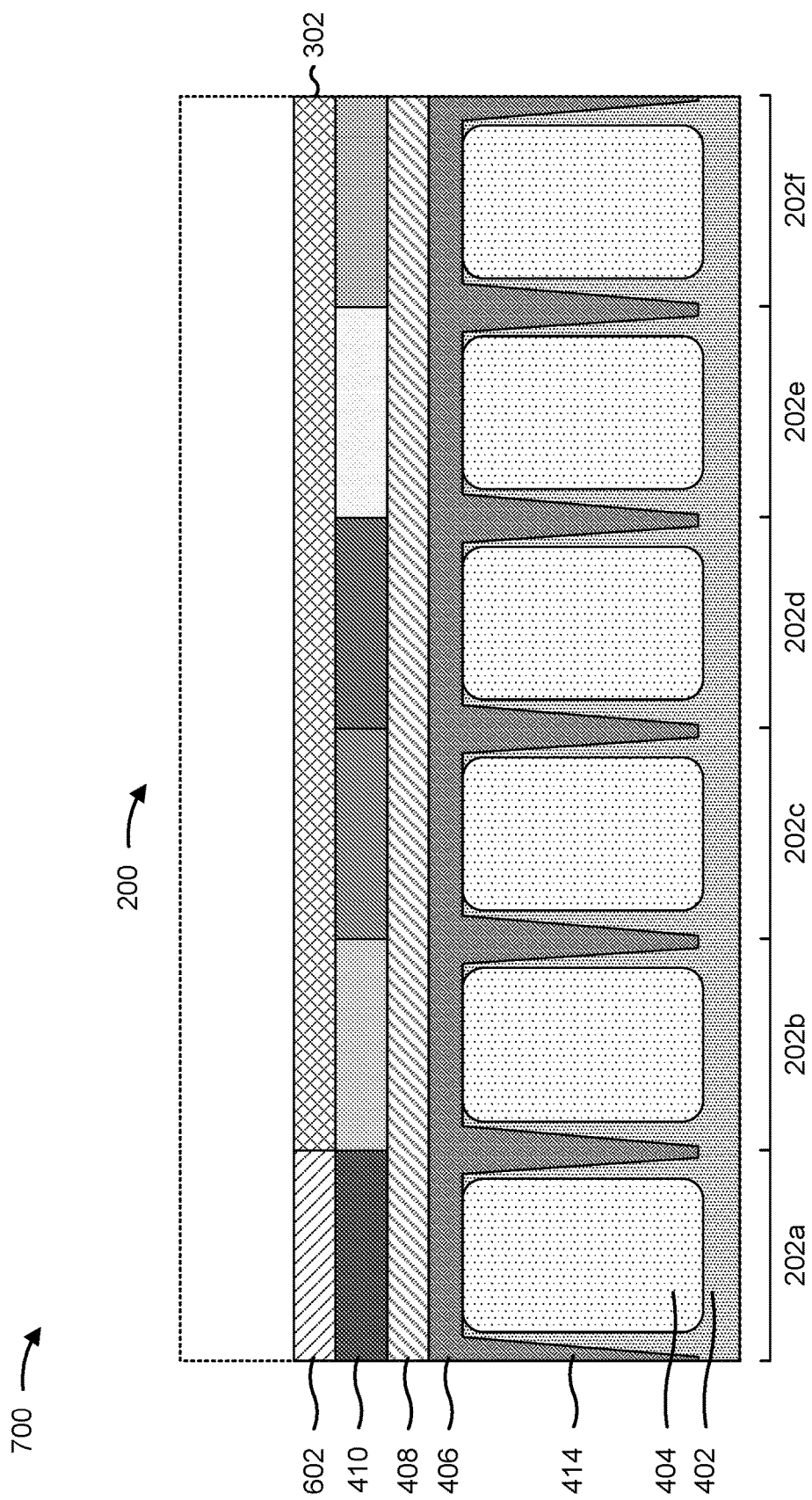
Figure 7C:
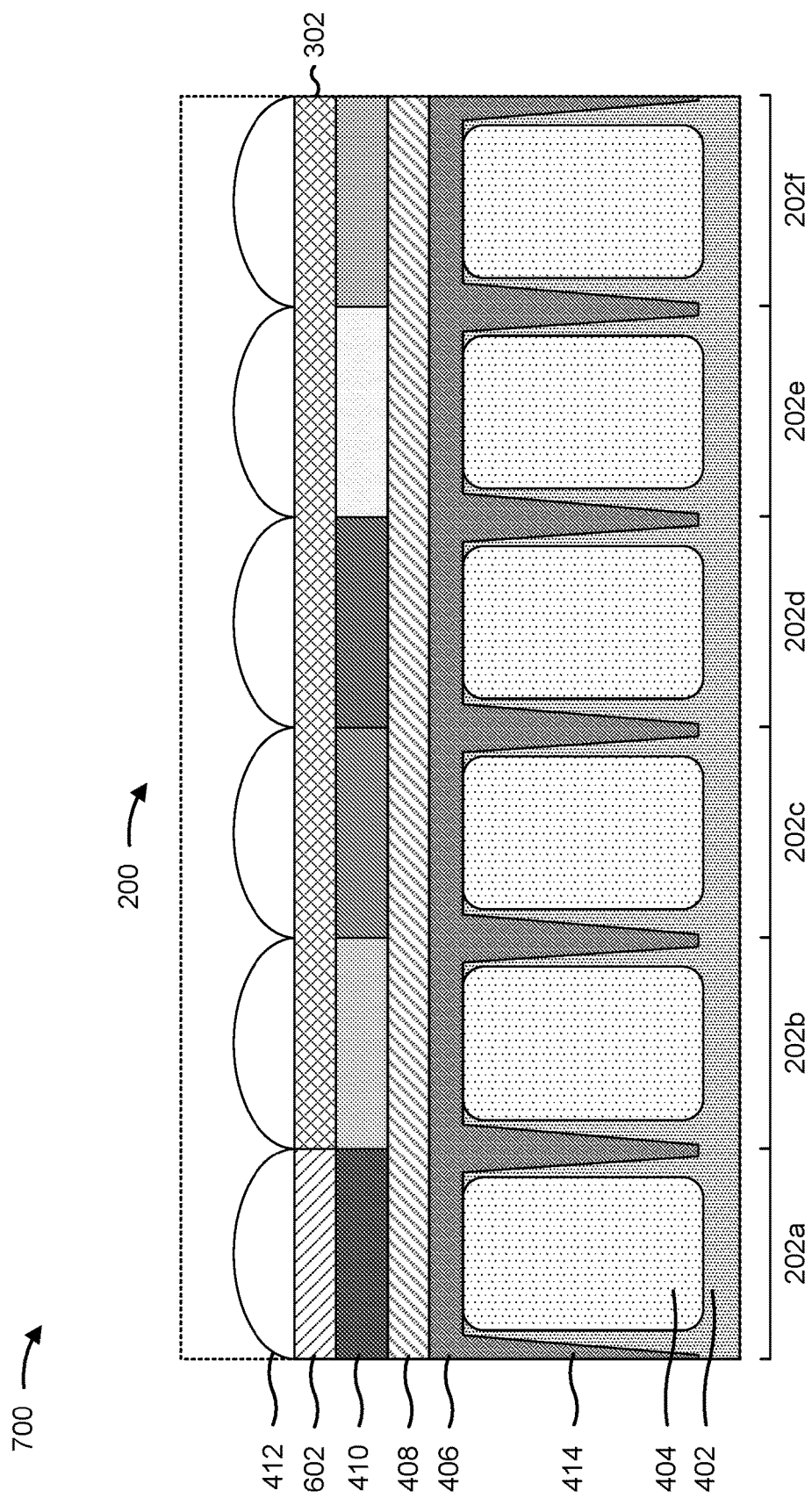

FIGS. 7A-7C are diagrams of an example 700 of forming a pixel array. In particular, FIGS. 7A-7C illustrate cross-sectional views of an example of forming the pixel array 200 in which the pixel array 200 includes the pixel sensor configuration illustrated and described above in connection with FIG. 6. The pixel array 200 may be formed as part of an image sensor (e.g., a CMOS image sensor, a BSI CMOS image sensor) manufacturing process. As shown in FIG. 7A, the processes and/or techniques used for the formation of the photodiodes 404, the oxide layer 406, the antireflective coating layer 408, the filter layer 410, and the DTI structures 414 may be similar to the processes and/or techniques described above in connection with FIGS. 5A-5H and are therefore omitted.

As shown in FIG. 7B, the MR cut filter layer 302 may be formed above and/or on the filter layer 410. In particular, the MR cut filter layer 302 may be formed above and/or on the portion of the filter layer 410 included in the visible light pixel sensors (e.g., pixel sensors 202b-202f) of the pixel array 200. One or more semiconductor processing tools may be used to form the MR cut filter layer 302. For example, the deposition tool 102 may form a photoresist layer on the filter layer 410, the exposure tool 104 may expose the photoresist layer to a radiation source to pattern the photoresist layer, the developer tool 106 may develop and remove portions of the photoresist layer to expose the pattern. The one or more semiconductor processing tools may form the pattern in the photoresist to block or prevent the MR cut filter layer 302 from being formed above and/or on the portion of the filter layer 410 included in the MR pixel sensors (e.g., the pixel sensor 202a) of the pixel array 200.

In some implementations, a semiconductor processing tool (e.g., the deposition tool 102) deposits the MR cut filter layer 302 based on the pattern formed in the photoresist layer using a CVD technique, a PVD technique, an ALD technique, or another type of deposition technique. The MR cut filter layer 302 may be formed to a suitable thickness to absorb or reflect the NIR component of incident light such that the MR component of the incident light is blocked from passing to the photodiodes 404 of the underlying visible light pixel sensors. In some implementations, the remaining photoresist layer is removed from the filter layer 410, and the passivation layer 602 may be deposited (e.g., by the deposition tool 102) over and/or on the portions of filter layer 410 included in the NIR pixel sensors of the pixel array 200. For example, the passivation layer 602 may be deposited using a CVD technique, a PVD technique, an ALD technique, or another type of deposition technique.

As shown in FIG. 7C, the micro-lens layer 412 may be formed above and/or on the MR cut filter layer 302 and the passivation layer 602. The micro-lens layer 412 may be formed such that each micro-lens in the micro lens layer 412 is formed over an associated pixel sensor 202. For example, the micro-lens layer 412 may be formed such that a micro-lens is formed over the pixel sensor 202a, such that another micro-lens is formed over the pixel sensor 202b, such that another micro-lens is formed over the pixel sensor 202c, and so on. The micro-lens layer 412 may, for example, be formed by a spin-on process or a deposition process and a reflow operation to curve upper or top surfaces of the micro-lenses.

As indicated above, FIGS. 7A-7C are provided as an example. Other examples may differ from what is described with regard to FIGS. 7A-7C.

Figure 8:
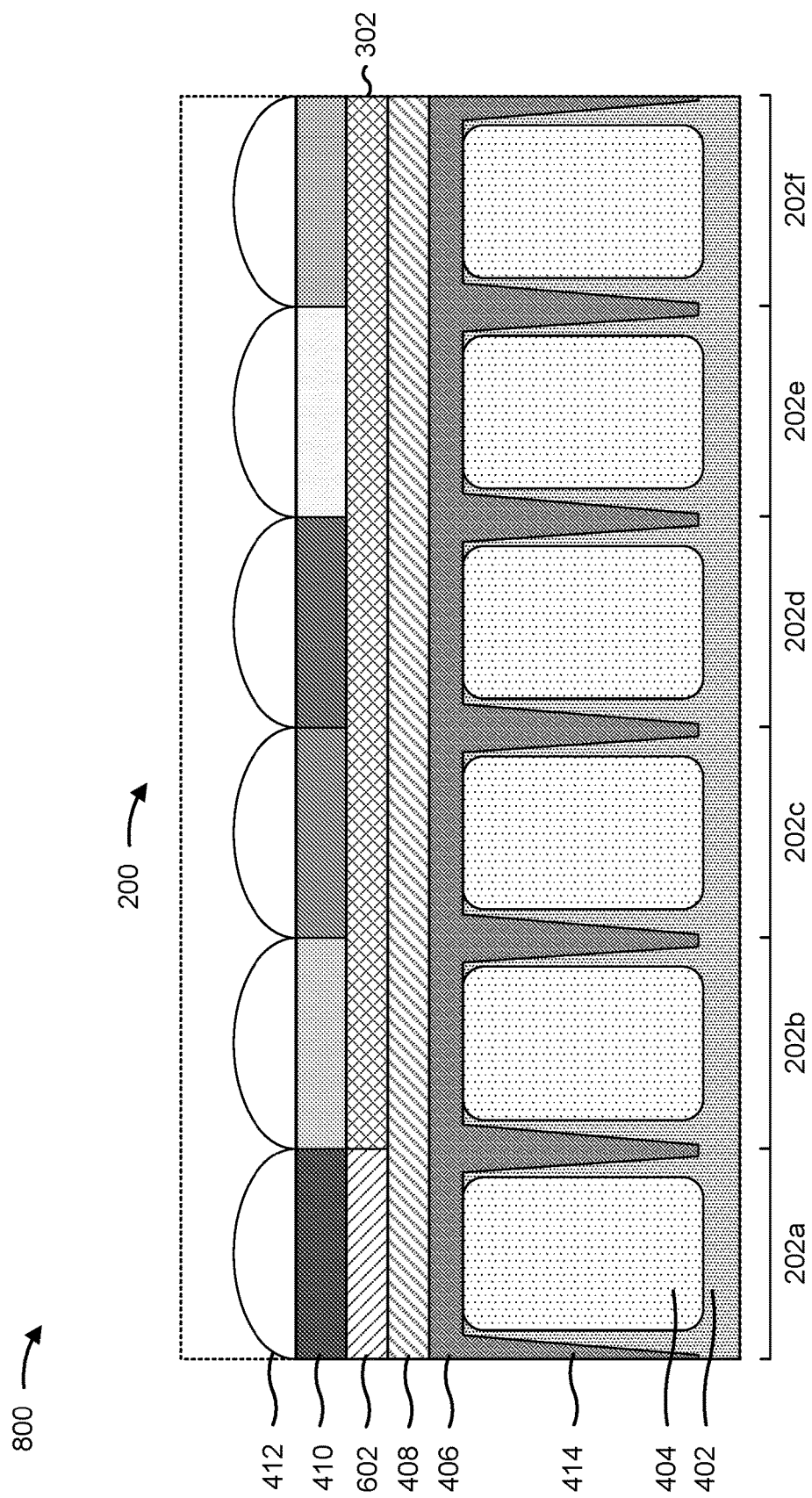
FIGS. 8-11 are diagrams of example pixel configurations for the example pixel array of FIG. 2.

FIG. 8 is a diagram of an example pixel sensor configuration 800 described herein. In some implementations, the example pixel sensor configuration 800 illustrated in FIG. 8 is a cross-sectional view of an example pixel sensor configuration for the pixel array 200 or a portion thereof. Other pixel sensor configurations similar to the example pixel sensor configuration 800 illustrated in FIG. 8 may be used for the pixel array 200 and/or other pixel arrays.

As shown in FIG. 8, the pixel array 200 may include the plurality of pixel sensors 202 (e.g., pixel sensors 202a-202f), the substrate 402, the plurality of photodiodes 404, the oxide layer 406, the antireflective coating layer 408, the filter layer 410, the micro-lens layer 412, the DTI structures 414, and the MR cut filter layer 302. In the example pixel sensor configuration 800 illustrated in FIG. 8, the NIR cut filter layer 302 is located above and/or on the antireflective coating layer 408, and below the filter layer 410 and the micro-lens layer 412. The filter layer 410 may be located above and/or on the MR cut filter layer 302, and the micro-lens layer 412 may be located above and/or on the filter layer 410. The passivation layer 602 may be included in the MR pixel sensors (e.g., the pixel sensor 202a) to provide a substantially flat layer composed, of the passivation layer 602 and the MR cut filter layer 302, on which the filter layer 410 may be formed.

As indicated above, FIG. 8 is provided as an example. Other examples may differ from what is described with regard to FIG. 8. The configuration of the layers of the pixel array 200, the configuration of the visible light pixel sensors, and/or the configuration of the MR pixel sensors described above in connection with FIG. 8 may be arranged according to the examples described above and/or arranged according to other examples to achieve or satisfy one or more performance parameters and/or attributes, such as color saturation, noise, contrast, brightness, hue and saturation, light sensitivity, contour sharpness, image sensor size, pixel sensor density, and/or the like.

Figure 9:
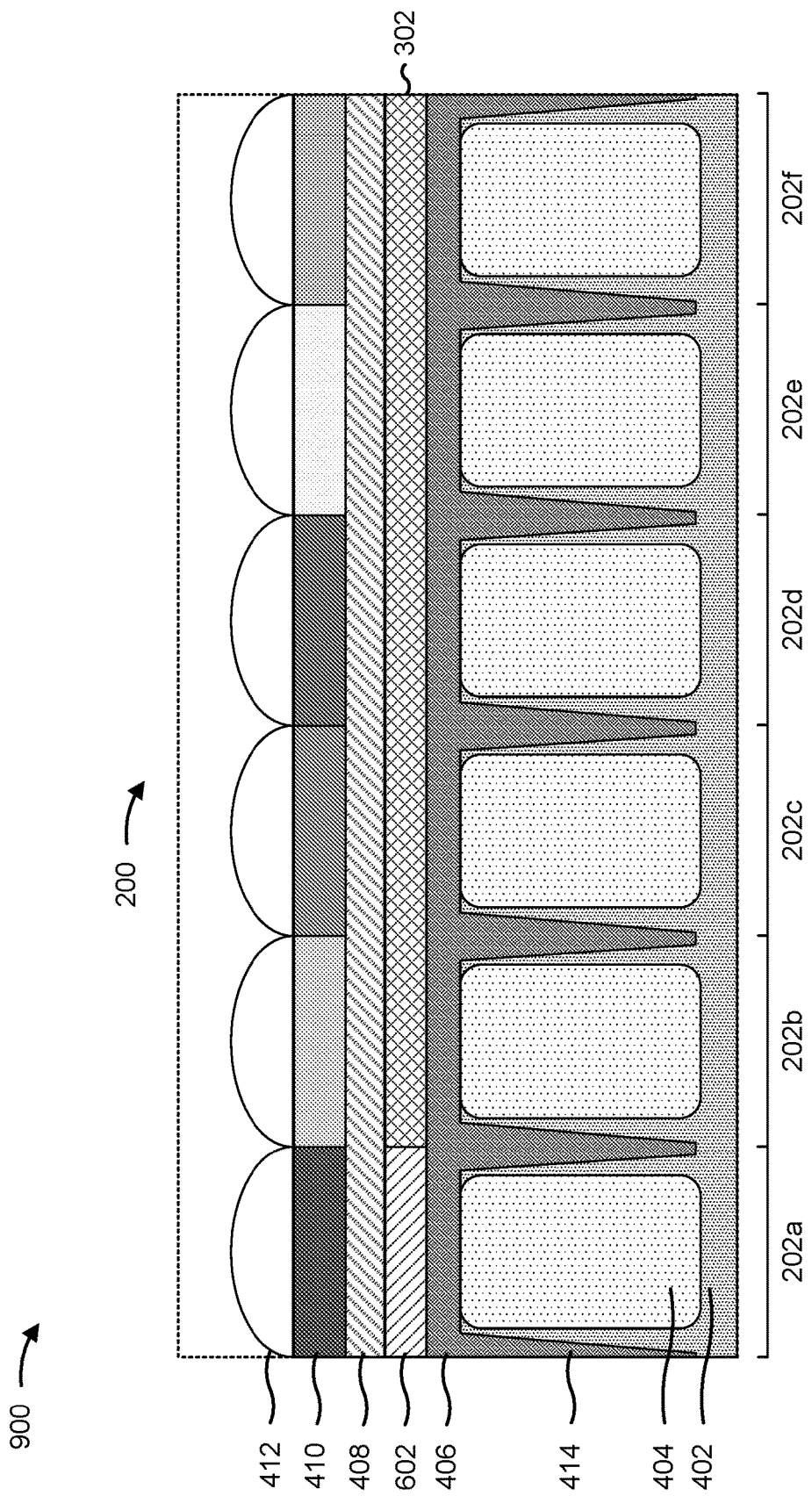

FIG. 9 is a diagram of an example pixel sensor configuration 900 described herein. In some implementations, the example pixel sensor configuration 900 illustrated in FIG. 9 is a cross-sectional view of an example pixel sensor configuration for the pixel array 200 or a portion thereof. Other pixel sensor configurations similar to the example pixel sensor configuration 900 illustrated in FIG. 9 may be used for the pixel array 200 and/or other pixel arrays.

As shown in FIG. 9, the pixel array 200 may include the plurality of pixel sensors 202 (e.g., pixel sensors 202a-202f), the substrate 402, the plurality of photodiodes 404, the oxide layer 406, the antireflective coating layer 408, the filter layer 410, the micro-lens layer 412, the DTI structures 414, and the MR cut filter layer 302. In the example pixel sensor configuration 900 illustrated in FIG. 9, the MR cut filter layer 302 is located above and/or on the oxide layer 406, and below the antireflective coating layer 408, the filter layer 410, and the micro-lens layer 412. The antireflective coating layer 408 may be located above and/or on the MR cut layer 302, the filter layer 410 may be located above and/or on the antireflective coating layer 408, and the micro-lens layer 412 may be located above and/or on the filter layer 410. The passivation layer 602 may be included in the MR pixel sensors (e.g., the pixel sensor 202a) to provide a substantially flat layer composed, of the passivation layer 602 and the MR cut filter layer 302, on which the antireflective coating layer 408 may be formed.

As indicated above, FIG. 9 is provided as an example. Other examples may differ from what is described with regard to FIG. 9. The configuration of the layers of the pixel array 200, the configuration of the visible light pixel sensors, and/or the configuration of the MR pixel sensors described above in connection with FIG. 9 may be arranged according to the examples described above and/or arranged according to other examples to achieve or satisfy one or more performance parameters and/or attributes, such as color saturation, noise, contrast, brightness, hue and saturation, light sensitivity, contour sharpness, image sensor size, pixel sensor density, and/or the like.

Figure 10:
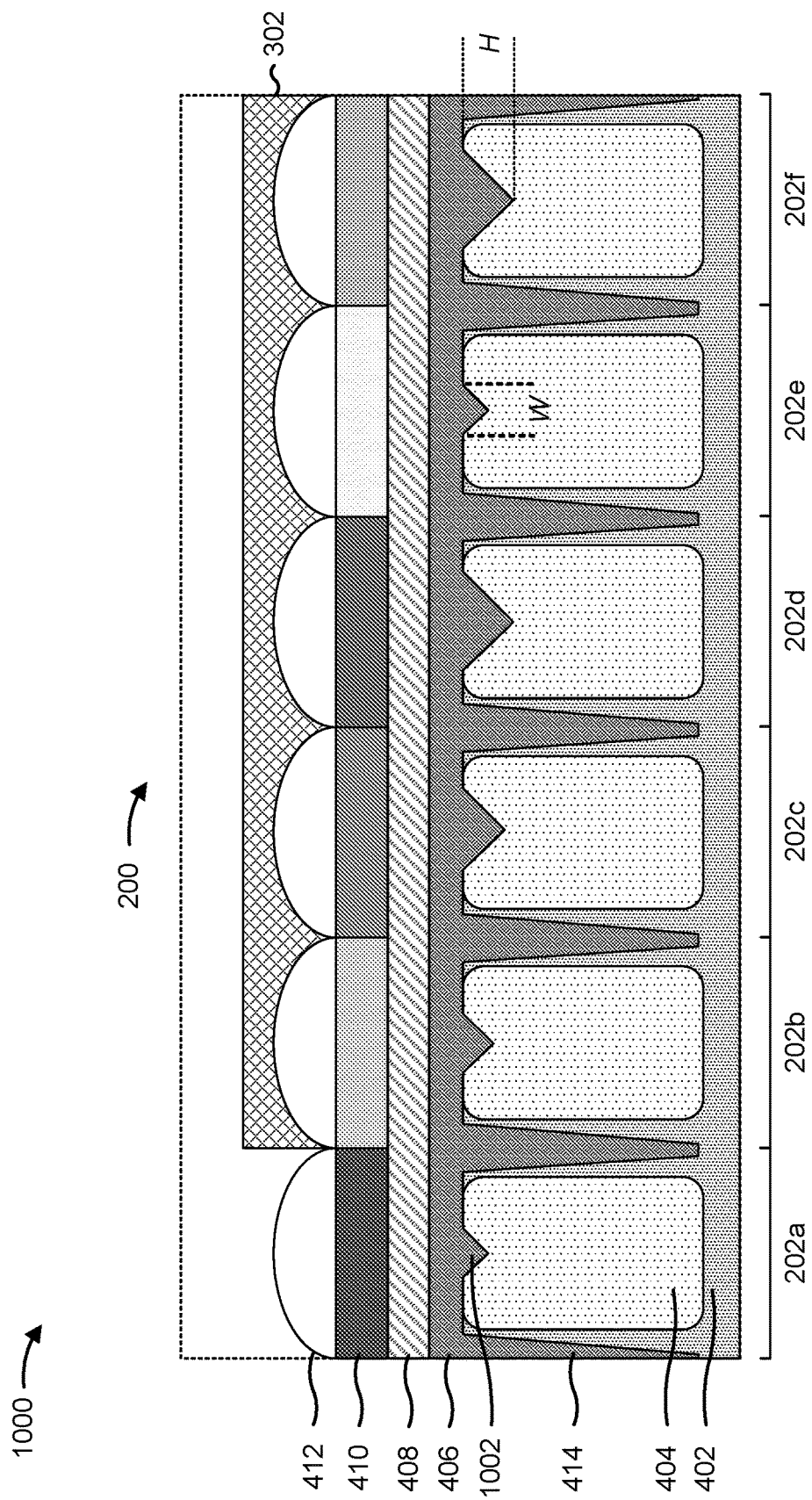

FIG. 10 is a diagram of an example pixel sensor configuration 1000 described herein. In some implementations, the example pixel sensor configuration 1000 illustrated in FIG. 10 is a cross-sectional view of an example pixel sensor configuration for the pixel array 200 or a portion thereof. Other pixel sensor configurations similar to the example pixel sensor configuration 1000 illustrated in FIG. 10 may be used for the pixel array 200 and/or other pixel arrays.

As shown in FIG. 10, the pixel array 200 may include the plurality of pixel sensors 202 (e.g., pixel sensors 202a-202f), the substrate 402, the plurality of photodiodes 404, the oxide layer 406, the antireflective coating layer 408, the filter layer 410, the micro-lens layer 412, the DTI structures 414, and the MR cut filter layer 302. In some implementations, the MR cut filter layer 302 may be located above and/or on the micro-lens layer 412, as shown in FIG. 10. In some implementations, the MR cut filter layer 302 is located below the micro-lens layer 412, and is included with an adjacent passivation layer 602, as described above in connection with FIG. 6, 8 or 9.

As further shown in FIG. 10, one or more of the pixel sensors 202 of the pixel array 200 may include a high absorption region 1002. A high absorption region 1002 may increase the absorption of incident light for a pixel sensor 202 (thereby increasing the quantum efficiency of the pixel sensor 202) by modifying or changing the orientation of the refractive interface between the photodiode 404 and the oxide layer 406. A high absorption region 1002 may include a structure having angled walls such that the structure is approximately triangle shaped. The angled walls of the high absorption region 1002 may be angled relative to the top surface of the substrate 402, and may be angled inward toward a photodiode 404. Thus, the angled walls change the orientation of the interface between the photodiode 404 and the oxide layer 406 by causing the interface to be diagonal relative to the orientation of top surface of the substrate 402. This change in orientation may result in a change in refraction relative to the flat surface of the top layer of the substrate 402 for the same angle of incidence of incident light. For example, increasing the inward angle of the angled walls relative to the top surface of the substrate 402 may decrease reflections of incident light traveling at a high angle of incidence relative to the top surface of the substrate 402 because the increased inward angle decreases the angle of incidence of the incident light relative to the angled walls of the high absorption region 1002. As a result, the high absorption region 1002 is capable of directing wider angles of incident light toward the center of the photodiode 404 than if no high absorption region 1002 were included in the pixel sensor 202.

In some implementations, all of the pixel sensors 202 of the pixel array 200 include a high absorption region 1002. In some implementations, a subset of the pixel sensors 202 of the pixel array 200 include a high absorption region 1002. In some implementations, all of a particular type of pixel sensor 202 (e.g., an MR pixel sensor, a visible light pixel sensor, or a red pixel sensor, among other examples) of the pixel array 200 include a high absorption region 1002. In some implementations, a first subset of a particular type of pixel sensor 202 of the pixel array 200 includes a high absorption region 1002, and a high absorption region 1002 is omitted from a second subset of the particular type of pixel sensor 202 of the pixel array 200. High absorption regions 1002 may be included in or excluded from the pixel sensors 202 of the pixel array 200 based on various factors, such as a target quantum efficiency for the pixel sensors 202, the intended application or use case for the pixel array 200 and/or the like. For example, high absorption regions 1002 might be included in the pixel sensors 202 of the pixel array 200 to achieve a high target quantum efficiency, or may be excluded from the pixel sensors 202 if a lower target quantum efficiency is specified. As another example, high absorption regions 1002 might be included in the pixel sensors 202 of the pixel array 200 if the intended application or use case for the pixel array 200 involves a large amount of expected off-angle or wide-angle incident light, or may be excluded from the pixel sensors 202 if the intended application or use case for the pixel array 200 primarily involves coherent or narrow-angle incident light (e.g., such as light emitted from a laser).

As shown in FIG. 10, a high absorption region 1002 may be formed in the substrate 402 and may extend into the photodiode 404 of a pixel sensor 202. For example, the substrate 402 may be patterned with a photoresist, and the photodiode region of a pixel sensor 202 may be etched based on the pattern in the photoresist to form a high absorption region 1002 for the pixel sensor 202. The high absorption region 1002 may be filled with the oxide material of the oxide layer 406 during deposition of the oxide layer 406.

In some implementations, the high absorption regions 1002 for a plurality of pixel sensors 202 may be the same size. For example, the high absorption regions 1002 for a plurality of pixel sensors 202 may have the same height H. In some implementations, the high absorption regions 1002 for a plurality of pixel sensors 202 may be different sizes. For example, the high absorption regions 1002 for a plurality of pixel sensors 202 may have different heights H. In some implementations, the height H for the high absorption regions 1002 for pixel sensors 202 of a particular type (e.g., MR pixel sensors, white pixel sensors, yellow pixel sensors, other types of pixel sensors) may be the same height. In some implementations, the height H for the high absorption regions 1002 for pixel sensors 202 of a particular type (e.g., MR pixel sensors, white pixel sensors, yellow pixel sensors, octagon-shaped pixel sensors, square-shaped pixel sensors, other types of pixel sensors) may be different heights. In some implementations, the height H for the high absorption regions 1002 for a first subset of pixel sensors 202 of a particular type (e.g., MR pixel sensors, white pixel sensors, yellow pixel sensors, other types of pixel sensors) may be the same height, and the height H for the high absorption regions 1002 for a second subset of pixel sensors 202 of a particular type (e.g., MR pixel sensors, white pixel sensors, yellow pixel sensors, other types of pixel sensors) may be different heights.

In some implementations, the height H for the high absorption regions 1002 for a first type of pixel sensors (e.g., MR pixel sensors) may be greater relative to the height H for high absorption regions 1002 for a second type of pixel sensors (e.g., blue pixel sensors). In some implementations, the height H for the high absorption region 1002 of a pixel sensor 202 may be based on a wavelength of incident light that is to be sensed or absorbed by the pixel sensor 202. For example, the height H for the high absorption regions 1002 included in the pixel array 200 may be increased as the wavelength of incident light that is to be sensed or absorbed increases, and may be decreased as the wavelength of incident light that is to be sensed or absorbed decreases. This is because increasing the height of a high absorption region 1002 results in larger (longer) angled walls that can better accommodate longer wavelengths of light, whereas decreasing the height of a high absorption region 1002 provides relatively smaller (shorter) angled walls for shorter wavelengths of light.

As an example, the height H for the high absorption regions 1002 included in blue pixel sensors the pixel array 200 may be the smallest height (e.g., because blue light is the shortest wavelength). The height H for the high absorption regions 1002 included in green pixel sensors the pixel array 200 may be larger than the height H for the high absorption regions 1002 included in the blue pixel sensors (e.g., because the wavelength of green light is greater than the wavelength of blue light). The height H for the high absorption regions 1002 included in yellow pixel sensors the pixel array 200 may be larger than the height H for the high absorption regions 1002 included in the green pixel sensors and the blue pixel sensors (e.g., because the wavelength of yellow light is greater than the wavelength of green light and the wavelength of blue light). The height H for the high absorption regions 1002 included in red pixel sensors the pixel array 200 may be larger than the height H for the high absorption regions 1002 included in the yellow pixel sensors, the green pixel sensors, and the blue pixel sensors (e.g., because the wavelength of red light is greater than the wavelength of yellow light, the wavelength of green light, and the wavelength of blue light). The height H for the high absorption regions 1002 included in MR pixel sensors the pixel array 200 may be larger than the height H for the high absorption regions 1002 included in the red pixel sensors, the yellow pixel sensors, the green pixel sensors, and the blue pixel sensors (e.g., because the wavelength of MR light is greater than the wavelength of red light, the wavelength of yellow light, the wavelength of green light, and the wavelength of blue light).

In some implementations, the height H of a high absorption region 1002 may be in a range of approximately 0.05 microns to approximately 0.3 microns for a blue pixel sensor. In some implementations, the height H of a high absorption region 1002 may be in a range of approximately 0.1 microns to approximately 0.4 microns for a green pixel sensor. In some implementations, the height H of a high absorption region 1002 may be in a range of approximately 0.2 microns to approximately 0.5 microns for a red pixel sensor. In some implementations, the height H of a high absorption region 1002 may be in a range of approximately 0.3 microns to approximately 0.8 microns for an MR pixel sensor.

In some implementations, the width W of a high absorption region 1002 may scale proportionally with the height H of the high absorption region 1002 to ensure that the angle of the angled walls of the high absorption region 1002 stays constant. In these examples, the width W of a high absorption region 1002 may increase proportionally with an increase in height H of the high absorption region 1002, or may decrease proportionally with a decrease in height H to ensure that the angle of the angled walls of the high absorption region 1002 stays constant.

As indicated above, FIG. 10 is provided as an example. Other examples may differ from what is described with regard to FIG. 10. The configuration of the layers of the pixel array 200, the configuration of the visible light pixel sensors, and/or the configuration of the MR pixel sensors described above in connection with FIG. 10 may be arranged according to the examples described above and/or arranged according to other examples to achieve or satisfy one or more performance parameters and/or attributes, such as color saturation, noise, contrast, brightness, hue and saturation, light sensitivity, contour sharpness, image sensor size, pixel sensor density, and/or the like.

Figure 11:
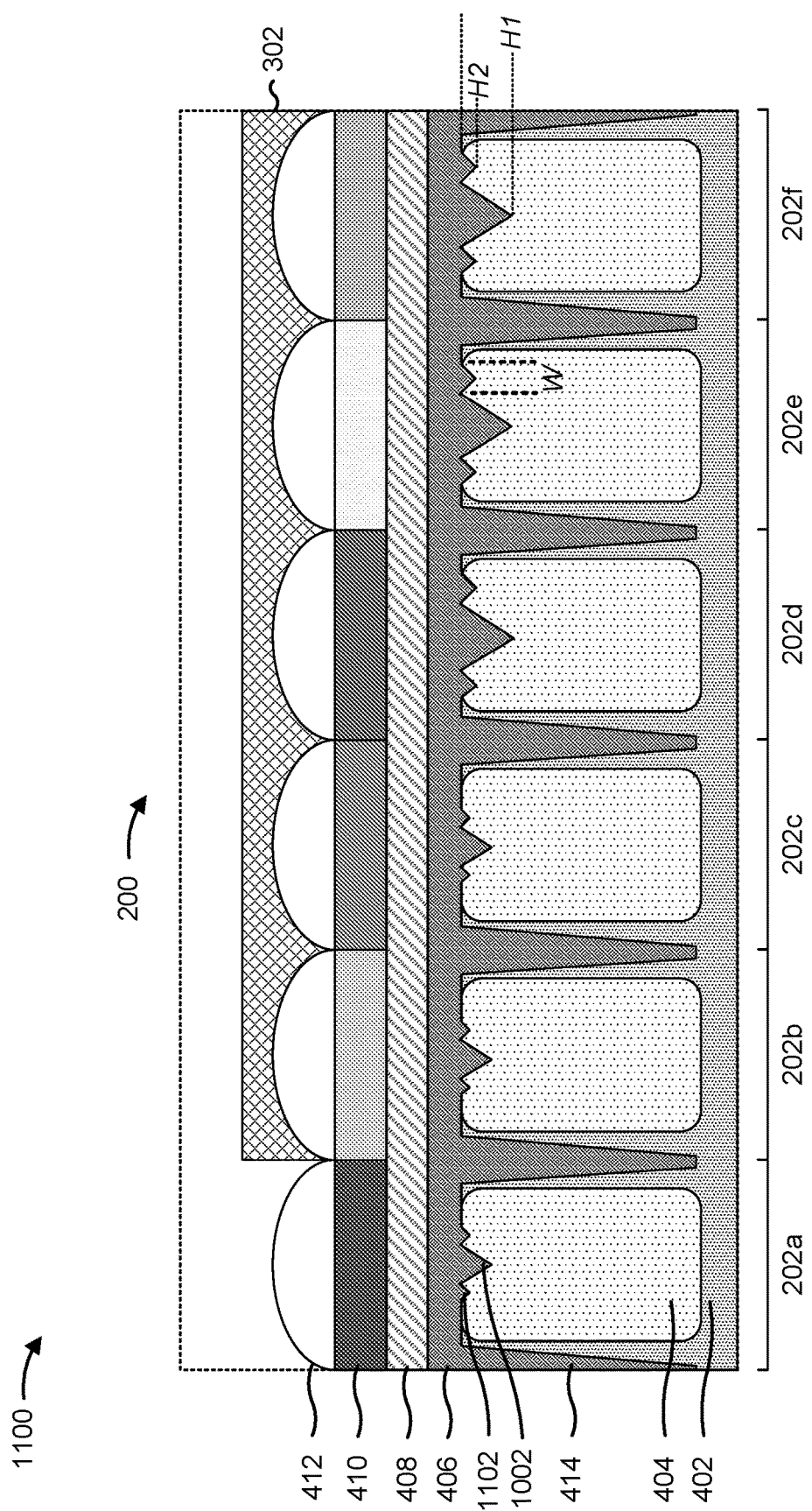

FIG. 11 is a diagram of an example pixel sensor configuration 1100 described herein. In some implementations, the example pixel sensor configuration 1100 illustrated in FIG. 11 is a cross-sectional view of an example pixel sensor configuration for the pixel array 200 or a portion thereof. Other pixel sensor configurations similar to the example pixel sensor configuration 1000 illustrated in FIG. 11 may be used for the pixel array 200 and/or other pixel arrays.

As shown in FIG. 11, the pixel array 200 may include the plurality of pixel sensors 202 (e.g., pixel sensors 202a-202f), the substrate 402, the plurality of photodiodes 404, the oxide layer 406, the antireflective coating layer 408, the filter layer 410, the micro-lens layer 412, the DTI structures 414, and the MR cut filter layer 302. In some implementations, the MR cut filter layer 302 may be located above and/or on the micro-lens layer 412, as shown in FIG. 11. In some implementations, the MR cut filter layer 302 is located below the micro-lens layer 412, and is included with an adjacent passivation layer 602, as described above in connection with FIG. 6, 8 or 9.

As further shown in FIG. 11, one or more of the pixel sensors 202 of the pixel array 200 may each include a plurality of high absorption regions, such as a high absorption region 1002 and a plurality of high absorption regions 1102. In some implementations, all of the pixel sensors 202 of the pixel array 200 include high absorption regions 1002 and 1102. In some implementations, a subset of the pixel sensors 202 of the pixel array 200 include high absorption regions 1002 and 1102. In some implementations, all of a particular type of pixel sensor 202 (e.g., an MR pixel sensor, a visible light pixel sensor, or a red pixel sensor, among other examples) of the pixel array 200 include high absorption regions 1002 and 1102. In some implementations, a first subset of a particular type of pixel sensor 202 of the pixel array 200 includes high absorption regions 1002 and 1102, and high absorption regions 1002 and 1102 are omitted from a second subset of the particular type of pixel sensor 202 of the pixel array 200.

As shown in FIG. 11, high absorption regions 1002 and 1102 be formed in the substrate 402 and may extend into the photodiode 404 of a pixel sensor 202. A high absorption region 1002 may increase the absorption of incident light for a pixel sensor 202 (thereby increasing the quantum efficiency of the pixel sensor 202) by modifying or changing the orientation of the refractive interface between the photodiode 404 and the oxide layer 406, as described above in connection with FIG. 10. The high absorption regions 1102 may increase the absorption of incident light for a pixel sensor 202 in a similar manner as the high absorption region 1002. Moreover, the high absorption regions 1102 may be included for the pixel sensor 202 to extend the surface area of the high absorption regions further across the photodiode 404 of the pixel sensor 202 than if only one high absorption region 1002 were included. In this way, the high absorption regions 1002 and 1102 are capable of directing wider angles of incident light toward the center of the photodiode 404 across a larger surface area.

High absorption regions 1102 may be included in or excluded from the pixel sensors 202 of the pixel array 200 based on various factors, such as a target quantum efficiency for the pixel sensors 202, the intended application or use case for the pixel array 200 and/or the like. For example, high absorption regions 1102 might be included in the pixel sensors 202 of the pixel array 200 to achieve a high target quantum efficiency, or may be excluded from the pixel sensors 202 if a lower target quantum efficiency is specified. As another example, high absorption regions 1102 might be included in the pixel sensors 202 of the pixel array 200 if the intended application or use case for the pixel array 200 involves a large amount of expected off-angle or wide-angle incident light, or may be excluded from the pixel sensors 202 if the intended application or use case for the pixel array 200 primarily involves coherent or narrow-angle incident light (e.g., such as light emitted from a laser).

In addition, the size of a high absorption region 1002 included in a pixel sensor 202 and the sizes of the high absorption regions 1102 included in the pixel sensor 202 may be different sizes such that the high absorption regions 1002 and 1102 are capable of directing wider angles of incident light toward the center of a photodiode 404 of the pixel sensor 202 across a larger range of wavelengths. For example, the high absorption region 1002 may be formed to a larger height H1 relative to the height H2 of the high absorption regions 1102. In this example, the high absorption region 1002 may redirect larger wavelengths of incident light relative to the high absorption regions 1102. In this way, for a pixel sensor 202 of a particular type, a high absorption region 1002 and the high absorption regions 1102 may be configured to redirect wide-angle incident light across a broader wavelength range for the pixel sensor 202 (e.g., than if a single high absorption region or no high absorption regions were included).

As an example, a blue light pixel sensor 202 may include a high absorption region 1002 configured to redirect blue light in a wavelength range from approximately 350 nanometers to approximately 450 nanometers, and may include one or more high absorption regions 1102 configured to redirect blue light in a wavelength range from approximately 450 nanometers to approximately 550 nanometers. In this way, the quantum efficiency for the blue light pixel sensor 202 may be increased cross a broad range of 200 nanometers of blue light wavelengths. As another example, a green light pixel sensor 202 may include a high absorption region 1002 configured to redirect green light in a wavelength range from approximately 450 nanometers to approximately 550 nanometers, and may include one or more high absorption regions 1102 configured to redirect green light in a wavelength range from approximately 550 nanometers to approximately 650 nanometers. As another example, a red light pixel sensor 202 may include a high absorption region 1002 configured to redirect red light in a wavelength range from approximately 550 nanometers to approximately 650 nanometers, and may include one or more high absorption regions 1102 configured to redirect red light in a wavelength range from approximately 650 nanometers to approximately 750 nanometers. As another example, an NIR light pixel sensor 202 may include a high absorption region 1002 configured to redirect MR light in a wavelength range from approximately 750 nanometers to approximately 850 nanometers, and may include one or more high absorption regions 1102 configured to redirect MR light in a wavelength range from approximately 850 nanometers to approximately 950 nanometers.

In some implementations, the high absorption regions 1002 for a plurality of pixel sensors 202 may be the same size (e.g., same height H1), and/or the high absorption regions 1102 for a plurality of pixel sensors 202 may be the same size (e.g., same height H2). In some implementations, the high absorption regions 1002 for a plurality of pixel sensors 202 may be different sizes (e.g., different heights H1), and/or the high absorption regions 1102 for a plurality of pixel sensors 202 may be different sizes (e.g., different heights H2). In some implementations, the height H1 for the high absorption regions 1002 for pixel sensors 202 of a particular type (e.g., MR pixel sensors, white pixel sensors, yellow pixel sensors, other types of pixel sensors) may be the same height, and/or the height H2 for the high absorption regions 1102 for pixel sensors 202 of a particular type (e.g., MR pixel sensors, white pixel sensors, yellow pixel sensors, other types of pixel sensors) may be the same height. In some implementations, the height H1 for the high absorption regions 1002 for pixel sensors 202 of a particular type (e.g., MR pixel sensors, white pixel sensors, yellow pixel sensors, other types of pixel sensors) may be different heights, and/or the height H2 for the high absorption regions 1102 for pixel sensors 202 of a particular type (e.g., MR pixel sensors, white pixel sensors, yellow pixel sensors, other types of pixel sensors) may be different heights.

In some implementations, the height H1 for the high absorption regions 1002 for a first subset of pixel sensors 202 of a particular type (e.g., MR pixel sensors, white pixel sensors, yellow pixel sensors, other types of pixel sensors) may be the same height, and the height H1 for the high absorption regions 1002 for a second subset of pixel sensors 202 of a particular type (e.g., MR pixel sensors, white pixel sensors, yellow pixel sensors, other types of pixel sensors) may be different heights. In some implementations, the height H2 for the high absorption regions 1102 for a first subset of pixel sensors 202 of a particular type (e.g., MR pixel sensors, white pixel sensors, yellow pixel sensors, other types of pixel sensors) may be the same height, and the height H1 for the high absorption regions 1002 for a second subset of pixel sensors 202 of a particular type (e.g., MR pixel sensors, white pixel sensors, yellow pixel sensors, other types of pixel sensors) may be different heights.

In some implementations, the height H1 for the high absorption regions 1002 for a first type of pixel sensors (e.g., MR pixel sensors) may be greater relative to the height H1 for high absorption regions 1002 for a second type of pixel sensors (e.g., blue pixel sensors), and/or the height H2 for the high absorption regions 1102 for the first type of pixel sensors may be greater relative to the height H2 for high absorption regions 1102 for a second type of pixel sensors. In some implementations, the height H1 for the high absorption region 1002 of a pixel sensor 202 may be based on a wavelength of incident light that is to be sensed or absorbed by the pixel sensor 202, and/or the height H2 for the high absorption regions 1102 of a pixel sensor 202 may be based on a wavelength of incident light that is to be sensed or absorbed by the pixel sensor 202. For example, the height H1 for the high absorption regions 1002 and/or the height H2 for the high absorption regions 1102 included in the pixel array 200 may be increased as the wavelength of incident light that is to be sensed or absorbed increases, and may be decreased as the wavelength of incident light that is to be sensed or absorbed decreases.

As an example, the height H1 for the high absorption regions 1002 and/or the height H2 for the high absorption regions 1102 included in blue pixel sensors the pixel array 200 may be the smallest height (e.g., because blue light is the shortest wavelength). The height H1 for the high absorption regions 1002 included in green pixel sensors the pixel array 200 may be larger than the height H1 for the high absorption regions 1002 included in the blue pixel sensors, and/or height H2 for the high absorption regions 1102 included in green pixel sensors the pixel array 200 may be larger than the height H2 for the high absorption regions 1102 included in the blue pixel sensors (e.g., because the wavelength of green light is greater than the wavelength of blue light). The height H1 for the high absorption regions 1002 included in yellow pixel sensors the pixel array 200 may be larger than the height H1 for the high absorption regions 1002 included in the green pixel sensors and the blue pixel sensors, and/or height H2 for the high absorption regions 1102 included in yellow pixel sensors the pixel array 200 may be larger than the height H2 for the high absorption regions 1102 included in the green pixel sensors and the blue pixel sensors (e.g., because the wavelength of yellow light is greater than the wavelength of green light and the wavelength of blue light).

The height H1 for the high absorption regions 1002 included in red pixel sensors the pixel array 200 may be larger than the height H1 for the high absorption regions 1002 included in the yellow pixel sensors, the green pixel sensors, and the blue pixel sensors, and/or the height H2 for the high absorption regions 1102 included in red pixel sensors the pixel array 200 may be larger than the height H2 for the high absorption regions 1102 included in the yellow pixel sensors, the green pixel sensors, and the blue pixel sensors (e.g., because the wavelength of red light is greater than the wavelength of yellow light, the wavelength of green light, and the wavelength of blue light). The height H1 for the high absorption regions 1002 included in MR pixel sensors the pixel array 200 may be larger than the height H1 for the high absorption regions 1002 included in the red pixel sensors, the yellow pixel sensors, the green pixel sensors, and the blue pixel sensors, and/or the height H2 for the high absorption regions 1102 included in MR pixel sensors the pixel array 200 may be larger than the height H2 for the high absorption regions 1102 included in the red pixel sensors, the yellow pixel sensors, the green pixel sensors, and the blue pixel sensors (e.g., because the wavelength of NIR light is greater than the wavelength of red light, the wavelength of yellow light, the wavelength of green light, and the wavelength of blue light).

In some implementations, the height H1 of a high absorption region 1002 may be in a range of approximately 0.05 microns to approximately 0.3 microns. In some implementations, the height H1 of a high absorption region 1002 may be in a range of approximately 0.1 microns to approximately 0.4 microns. In some implementations, the height H1 of a high absorption region 1002 may be in a range of approximately 0.2 microns to approximately 0.5 microns. In some implementations, the height H1 of a high absorption region 1002 may be in a range of approximately 0.3 microns to approximately 0.8 microns. In some implementations, the height H2 of a high absorption region 1102 may be in a range of approximately 0.01 microns to approximately 0.2 microns. In some implementations, the height H2 of a high absorption region 1102 may be in a range of approximately 0.05 microns to approximately 0.3 microns.

In some implementations, the width W of a high absorption region 1102 may scale proportionally with the height H2 of the high absorption region 1102 to ensure that the angle of the angled walls of the high absorption region 1002 stays constant. In these examples, the width W of a high absorption region 1002 may increase proportionally with an increase in height H2 of the high absorption region 1002, or may decrease proportionally with a decrease in height H2 to ensure that the angle of the angled walls of the high absorption region 1002 stays constant.

As indicated above, FIG. 11 is provided as an example. Other examples may differ from what is described with regard to FIG. 11. The configuration of the layers of the pixel array 200, the configuration of the visible light pixel sensors, and/or the configuration of the MR pixel sensors described above in connection with FIG. 11 may be arranged according to the examples described above and/or arranged according to other examples to achieve or satisfy one or more performance parameters and/or attributes, such as color saturation, noise, contrast, brightness, hue and saturation, light sensitivity, contour sharpness, image sensor size, pixel sensor density, and/or the like.

Figure 12:
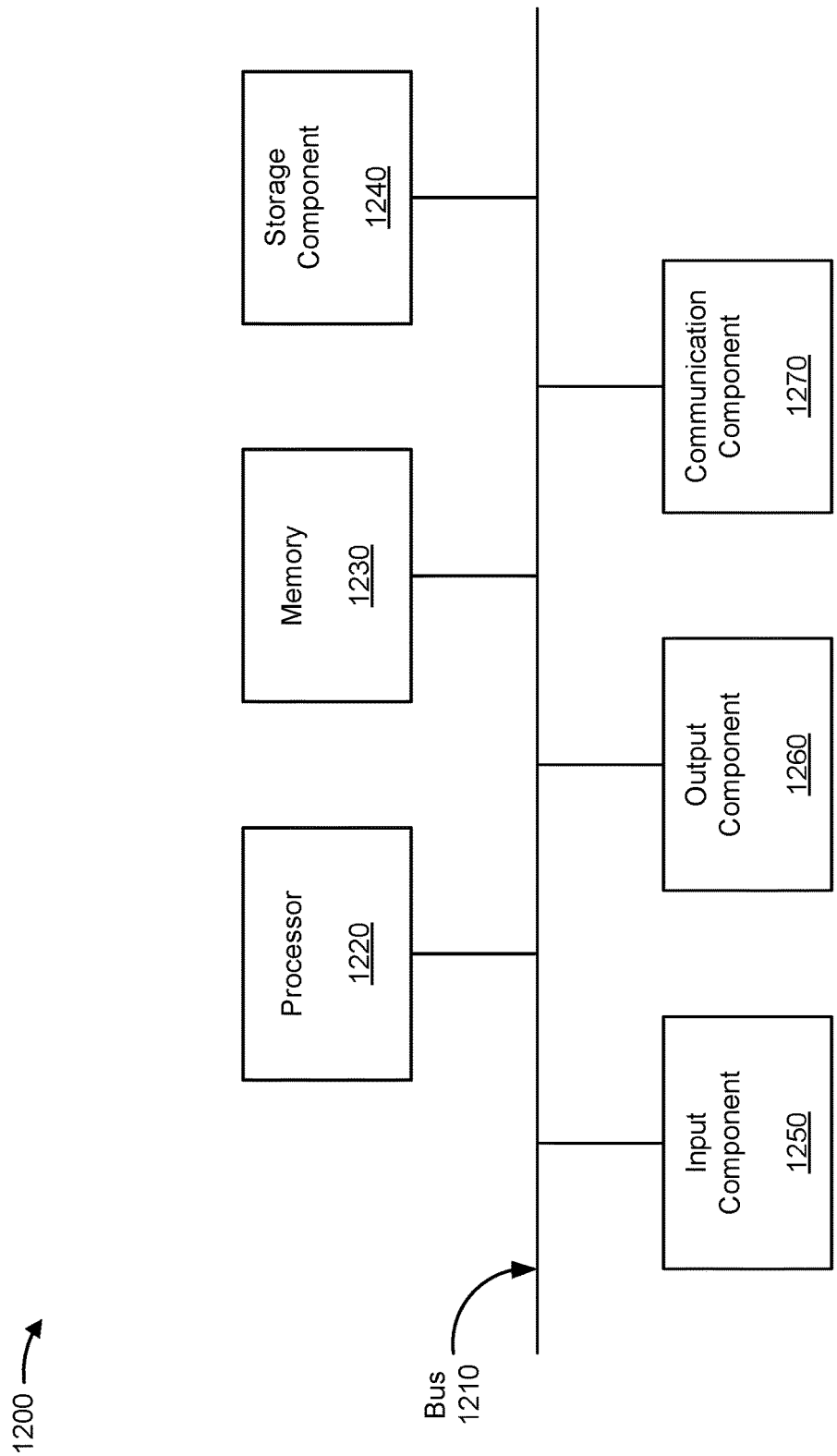
FIG. 12 is a diagram of example components of one or more devices of FIG. 1.

FIG. 12 is a diagram of example components of a device 1200. In some implementations, one or more of the semiconductor processing tools 102-112 and/or the wafer/die transport tool 114 may include one or more devices 1200 and/or one or more components of device 1200. As shown in FIG. 12, device 1200 may include a bus 1210, a processor 1220, a memory 1230, a storage component 1240, an input component 1250, an output component 1260, and a communication component 1270.

Bus 1210 includes a component that enables wired and/or wireless communication among the components of device 1200. Processor 1220 includes a central processing unit, a graphics processing unit, a microprocessor, a controller, a microcontroller, a digital signal processor, a field-programmable gate array, an application-specific integrated circuit, and/or another type of processing component. Processor 1220 is implemented in hardware, firmware, or a combination of hardware and software. In some implementations, processor 1220 includes one or more processors capable of being programmed to perform a function. Memory 1230 includes a random access memory, a read only memory, and/or another type of memory (e.g., a flash memory, a magnetic memory, and/or an optical memory).

Storage component 1240 stores information and/or software related to the operation of device 1200. For example, storage component 1240 may include a hard disk drive, a magnetic disk drive, an optical disk drive, a solid state disk drive, a compact disc, a digital versatile disc, and/or another type of non-transitory computer-readable medium. Input component 1250 enables device 1200 to receive input, such as user input and/or sensed inputs. For example, input component 1250 may include a touch screen, a keyboard, a keypad, a mouse, a button, a microphone, a switch, a sensor, a global positioning system component, an accelerometer, a gyroscope, an actuator, and/or the like. Output component 1260 enables device 1200 to provide output, such as via a display, a speaker, and/or one or more light-emitting diodes. Communication component 1270 enables device 1200 to communicate with other devices, such as via a wired connection and/or a wireless connection. For example, communication component 1270 may include a receiver, a transmitter, a transceiver, a modem, a network interface card, an antenna, and/or the like.

Device 1200 may perform one or more processes described herein. For example, a non-transitory computer-readable medium (e.g., memory 1230 and/or storage component 1240) may store a set of instructions (e.g., one or more instructions, code, software code, program code, and/or the like) for execution by processor 1220. Processor 1220 may execute the set of instructions to perform one or more processes described herein. In some implementations, execution of the set of instructions, by one or more processors 1220, causes the one or more processors 1220 and/or the device 1200 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 12 are provided as an example. Device 1200 may include additional components, fewer components, different components, or differently arranged components than those shown in FIG. 12. Additionally, or alternatively, a set of components (e.g., one or more components) of device 1200 may perform one or more functions described as being performed by another set of components of device 1200.

Figure 13:
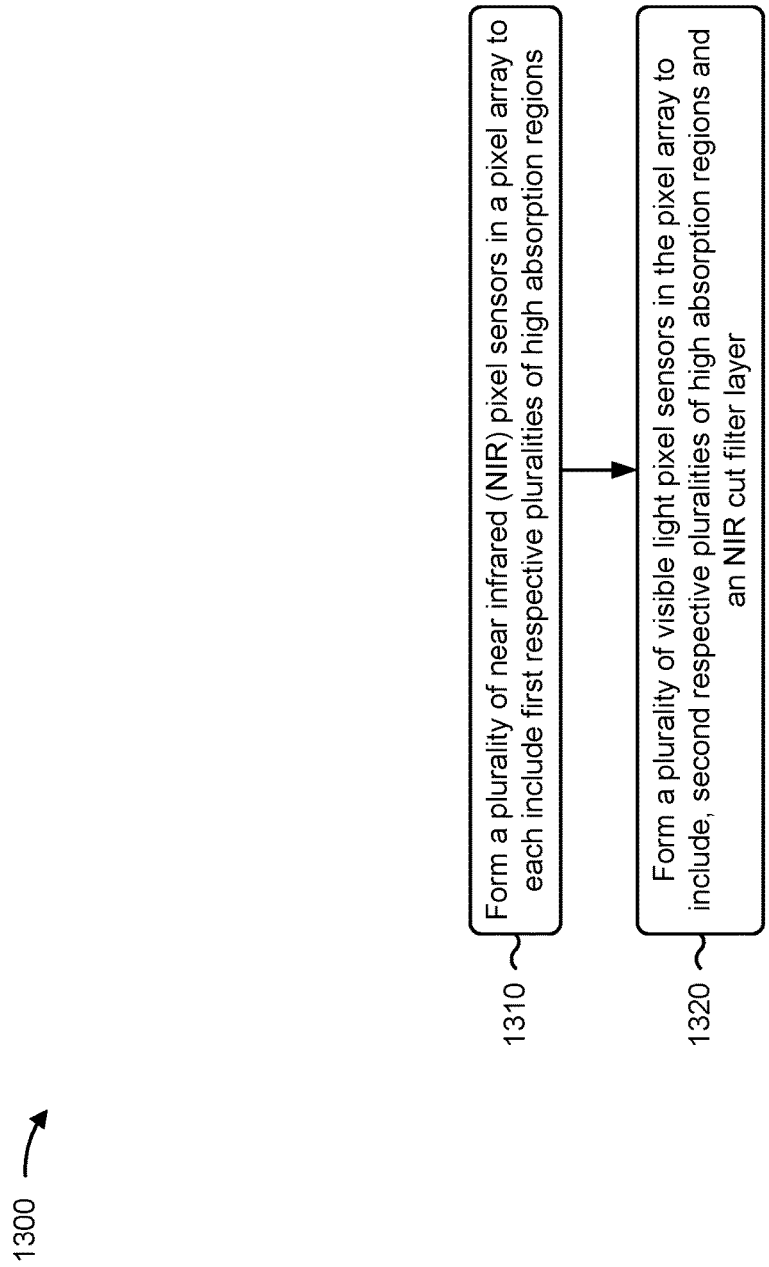
FIG. 13 is a flowchart of an example process relating to forming an image sensor described herein.

FIG. 13 is a flowchart of an example process 1300 associated with pixel array including octagon pixel sensors.

In some implementations, one or more process blocks of FIG. 13 may be performed by one or more semiconductor processing tools (e.g., one or more of the semiconductor processing tools 102-112). Additionally, or alternatively, one or more process blocks of FIG. 13 may be performed by one or more components of device 1200, such as processor 1220, memory 1230, storage component 1240, input component 1250, output component 1260, and/or communication component 1270.

As shown in FIG. 13, process 1300 may include forming a plurality of NIR pixel sensors in a pixel array to each include first respective pluralities of high absorption regions (block 1310). For example, the one or more semiconductor processing tools (e.g., the semiconductor processing tools 102-112) may form a plurality of MR pixel sensors (e.g., pixel sensors 202, octagon-shaped pixel sensors 204, and/or square-shaped pixel sensors 206) in the pixel array 200 to each include first respective pluralities of high absorption regions 1002 and 1102, as described above.

As further shown in FIG. 13, process 1300 may include forming a plurality of visible light pixel sensors in the pixel array to include second respective pluralities of high absorption regions and an MR cut filter layer (block 1320). For example, the one or more semiconductor processing tools (e.g., the semiconductor processing tools 102-112) may form a plurality of visible light pixel sensors (e.g., pixel sensors 202, octagon-shaped pixel sensors 204, and/or square-shaped pixel sensors 206) in the pixel array 200 to include second respective pluralities of high absorption regions 1002 and 1102, and an MR cut filter layer 302, as described above.

Process 1300 may include additional implementations, such as any single implementation or any combination of implementations described below and/or in connection with one or more other processes described elsewhere herein.

In a first implementation, forming the plurality of MR pixel sensors to each include the first respective pluralities of high absorption regions includes forming, for an MR pixel sensor of the plurality of MR pixel sensors a first high absorption region 1002, and a plurality of second high absorption regions 1102, wherein a size (e.g., height H1) of the first high absorption region 1002 and a size (e.g., height H2) of each of the plurality of second high absorption regions 1102 are different sizes. In a second implementation, alone or in combination with the first implementation, forming the plurality of visible light pixel sensors to each include the second respective pluralities of high absorption regions 1102 includes forming, for a visible light pixel sensor of the plurality of visible light pixel sensors a third high absorption region 1002, and a plurality of fourth high absorption regions 1102, wherein a size (e.g., height H1) of the third high absorption region 1002 and a size (e.g., height H2) of each of the plurality of fourth high absorption regions 1102 are different sizes.

In a third implementation, alone or in combination with one or more of the first and second implementations, at least one of the size (e.g., height H1) of the first high absorption region 1002 and the size (e.g., height H1) of the third high absorption region 1002 are different sizes, or the size (e.g., height H2) of each of the plurality of second high absorption regions 1102 and the size (e.g., height H2) of each of the plurality of fourth high absorption regions 1102 are different sizes. In a fourth implementation, alone or in combination with one or more of the first through third implementations, the plurality of visible light pixel sensors include at least one of a plurality of red pixel sensors, a plurality of blue pixel sensors, a plurality of green pixel sensors, a plurality of yellow pixel sensors, or a plurality of white pixel sensors.

Although FIG. 13 shows example blocks of process 1300, in some implementations, process 1300 may include additional blocks, fewer blocks, different blocks, or differently arranged blocks than those depicted in FIG. 13. Additionally, or alternatively, two or more of the blocks of process 1300 may be performed in parallel.

In this way, a pixel array may include an NIR cut filter layer for visible light pixel sensors of the pixel array. The MR cut filter layer is included in the pixel array to absorb or reflect MR light for the visible light pixel sensors to reduce (or completely eliminate) the amount of MR light absorbed by the visible light pixel sensors. This increases the accuracy of the color information provided by the visible light pixel sensors, which can be used to produce more accurate images. In addition, the visible light pixel sensors and/or MR pixel sensors may include high absorption regions to adjust the angle of incidence for the visible light pixel sensors and/or the MR pixel sensors. In this way, the high absorption regions may be used to adjust the orientation of the angle of refraction to increase the amount of incident light that is absorbed by the visible light pixel sensors and/or the MR pixel sensors, which increases the quantum efficiency of the visible light pixel sensors and/or the MR pixel sensors.

As described in greater detail above, some implementations described herein provide a pixel array. The pixel array includes one or more MR pixel sensors. The pixel array includes one or more visible light pixel sensors. The one or more visible light pixel sensors include an MR cut filter layer.

As described in greater detail above, some implementations described herein provide a pixel array. The pixel array includes a plurality of MR pixel sensors. The pixel array includes a plurality of visible light pixel sensors. The plurality of visible light pixel sensors include an MR cut filter layer. Each of the plurality of MR pixel sensors and each of the plurality of visible light pixel sensors include respective high absorption regions.

As described in greater detail above, some implementations described herein provide a method. The method includes forming a plurality of MR pixel sensors in a pixel array to each include first respective pluralities of high absorption regions. The method includes forming a plurality of visible light pixel sensors in the pixel array to include second respective pluralities of high absorption regions, and an MR cut filter layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pixel array, comprising:
one or more near infrared (NIR) pixel sensors;
one or more visible light pixel sensors,
    wherein the one or more visible light pixel sensors include an NIR cut filter layer; and
a plurality of high absorption regions for at least one of an NIR pixel sensor, of the one or more NIR pixel sensors, or a visible light pixel sensor, of the one or more visible light pixel sensors,
    wherein the plurality of high absorption regions comprises:
        a first high absorption region, and
        a plurality of second high absorption regions,
            wherein a size of the first high absorption region is different from a size of each of the plurality of second high absorption regions.

2. The pixel array of claim 1, wherein the NIR cut filter layer is located above a micro-lens layer of the one or more visible light pixel sensors.

3. The pixel array of claim 1, wherein the NIR cut filter layer is located below a micro-lens layer of the one or more visible light pixel sensors; and
    wherein the NIR cut filter layer is located above a filter layer of the one or more visible light pixel sensors.

4. The pixel array of claim 1, wherein the NIR cut filter layer is located below a filter layer of the one or more visible light pixel sensors; and
    wherein the NIR cut filter layer is located above an antireflective coating layer of the one or more visible light pixel sensors.

5. The pixel array of claim 1, wherein the NIR cut filter layer is located below an antireflective coating layer of the one or more visible light pixel sensors; and
    wherein the NIR cut filter layer is located above an oxide layer of the one or more visible light pixel sensors.

6. The pixel array of claim 1, wherein the one or more NIR pixel sensors are octagon-shaped pixel sensors; and
    wherein the one or more visible light pixel sensors are square-shaped pixel sensors.

7. The pixel array of claim 1, wherein the one or more NIR pixel sensors are square-shaped pixel sensors; and
    wherein the one or more visible light pixel sensors are octagon-shaped pixel sensors.

8. The pixel array of claim 1, wherein a first subset of the one or more NIR pixel sensors are octagon-shaped pixel sensors;
    wherein a second subset of the one or more NIR pixel sensors are square-shaped pixel sensors;
    wherein a first subset of the one or more visible light pixel sensors are octagon-shaped pixel sensors; and
    wherein a second subset of the one or more visible light pixel sensors are square-shaped pixel sensors.

9. A pixel array, comprising:
a plurality of near infrared (NIR) pixel sensors; and
a plurality of visible light pixel sensors,
    wherein the plurality of visible light pixel sensors includes an NIR cut filter layer, and
    wherein each of the plurality of NIR pixel sensors and each of the plurality of visible light pixel sensors include respective high absorption regions,
        wherein at least one of:
            a height of a first subset of the respective high absorption regions is in a range of approximately 0.05 microns to approximately 0.3 microns,
            a height of a second subset of the respective high absorption regions is in a range of approximately 0.1 microns to approximately 0.4 microns, a height of a third subset of the respective high absorption regions is in a range of approximately 0.2 microns to approximately 0.5 microns, or a height of a fourth subset of the respective high absorption regions is in a range of approximately 0.3 microns to approximately 0.8 microns.

10. The pixel array of claim 9, wherein the respective high absorption regions are a same size.

11. The pixel array of claim 9, wherein at least a subset of the respective high absorption regions are different sizes.

12. The pixel array of claim 9, wherein at least two of:
the height of the first subset of the respective high absorption regions is in the range of approximately 0.05 microns to approximately 0.3 microns,
the height of the second subset of the respective high absorption regions is in the range of approximately 0.1 microns to approximately 0.4 microns,
the height of the third subset of the respective high absorption regions is in the range of approximately 0.2 microns to approximately 0.5 microns, or
the height of the fourth subset of the respective high absorption regions is in the range of approximately 0.3 microns to approximately 0.8 microns.

13. The pixel array of claim 9, wherein the NIR cut filter is located above a micro-lens layer of the pixel array.

14. The pixel array of claim 9, wherein the NIR cut filter is located below a micro-lens layer of the pixel array.

15. The pixel array of claim 9, wherein a first subset of the plurality of NIR pixel sensors are octagon-shaped pixel sensors;
wherein a second subset of the plurality of NIR pixel sensors are square-shaped pixel sensors;
wherein a first subset of the plurality of visible light pixel sensors are octagon-shaped pixel sensors; and
wherein a second subset of the plurality of visible light pixel sensors are square-shaped pixel sensors.

16. A method, comprising:
forming a plurality of near infrared (NIR) pixel sensors in a pixel array to each include first respective pluralities of high absorption regions; and
forming a plurality of visible light pixel sensors in the pixel array to include:
second respective pluralities of high absorption regions, and
an NIR cut filter layer,
wherein at least one of:
the first respective pluralities of high absorption regions, for an NIR pixel sensor of the plurality of NIR pixel sensors, comprises:
a first high absorption region, and
a plurality of second high absorption regions,
wherein a size of the first high absorption region is different from a size of each of the plurality of second high absorption regions, or
the second respective pluralities of high absorption regions, for a visible light pixel sensor of the plurality of visible light pixel sensors, comprises:
a third high absorption region, and
a plurality of fourth high absorption regions,
wherein a size of the third high absorption region is different from a size of each of the plurality of fourth high absorption regions.

17. The method of claim 16, wherein forming the plurality of NIR pixel sensors to each include the first respective pluralities of high absorption regions comprises:
forming, for the NIR pixel sensor of the plurality of NIR pixel sensors:
the first high absorption region, and
the plurality of second high absorption regions,
wherein a size of the first high absorption region is different from a size of each of the plurality of second high absorption regions.

18. The method of claim 17, wherein forming the plurality of visible light pixel sensors to each include the second respective pluralities of high absorption regions comprises:
forming, for the visible light pixel sensor of the plurality of visible light pixel sensors:
the third high absorption region, and
the plurality of fourth high absorption regions,
wherein a size of the third high absorption region is different from a size of each of the plurality of fourth high absorption regions.

19. The method of claim 18, wherein at least one of:
the size of the first high absorption region and the size of the third high absorption region are different sizes, or
the size of each of the plurality of second high absorption regions and the size of each of the plurality of fourth high absorption regions are different sizes.

20. The method of claim 16, wherein the plurality of visible light pixel sensors include at least one of:
a plurality of red pixel sensors,
a plurality of blue pixel sensors,
a plurality of green pixel sensors,
a plurality of yellow pixel sensors, or
a plurality of white pixel sensors.

* * * * *

UNITED STATES PATENT AND TRADEMARK OFFICE
CERTIFICATE OF CORRECTION

PATENT NO. : 12,051,704 B2
APPLICATION NO. : 17/446401
DATED : July 30, 2024
INVENTOR(S) : Feng-Chien Hsieh et al.

Page 1 of 1

It is certified that error appears in the above-identified patent and that said Letters Patent is hereby corrected as shown below:

On the Title Page

In item (57) ABSTRACT, Lines 5, 10, 12 and 14, "MR" should be changed to --NIR--.

Signed and Sealed this
Eighth Day of October, 2024

Katherine Kelly Vidal
*Director of the United States Patent and Trademark Office*